US012785628B2

(12) United States Patent
Ashida et al.

(10) Patent No.: US 12,785,628 B2
(45) Date of Patent: Nov. 3, 2026

(54) POWER AMPLIFICATION DEVICE

(71) Applicant: Murata Manufacturing Co., Ltd., Nagaokakyo (JP)

(72) Inventors: Tetsurou Ashida, Nagaokakyo (JP); Kensuke Takimoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 314 days.

(21) Appl. No.: 18/785,004

(22) Filed: Jul. 26, 2024

(65) Prior Publication Data

US 2025/0047244 A1 Feb. 6, 2025

(30) Foreign Application Priority Data

Aug. 3, 2023 (JP) ................................ 2023-127406

(51) Int. Cl.
*H03F 1/00* (2006.01)
*H03F 1/02* (2006.01)
*H03F 3/24* (2006.01)

(52) U.S. Cl.
CPC ........... *H03F 1/0288* (2013.01); *H03F 3/245* (2013.01); *H03F 2200/09* (2013.01); *H03F 2200/451* (2013.01)

(58) Field of Classification Search
None
See application file for complete search history.

(56) References Cited

U.S. PATENT DOCUMENTS 9,774,300 B2 * 9/2017 Jin .......................... H03F 3/245
2021/0135657 A1 * 5/2021 Tsutsui ................ H03F 3/45085
2022/0189936 A1 * 6/2022 Tsutsui ...................... H03F 1/56
2023/0261622 A1 * 8/2023 Imai ........................ H03F 3/211 330/295
2024/0120887 A1 * 4/2024 Cavarroc ............. H03F 1/3288

FOREIGN PATENT DOCUMENTS

JP 2022-170224 A 11/2022

* cited by examiner

*Primary Examiner* — Tuan T Lam
(74) *Attorney, Agent, or Firm* — XSENSUS LLP

(57) ABSTRACT

A power amplification device that includes a substrate having a surface; an integrated circuit including a carrier amplifier and a peak amplifier and disposed on the surface; a carrier balun connected to the carrier amplifier; a peak balun connected to the peak amplifier; and a surface mount device disposed on the surface. Each of the carrier amplifier and the peak amplifier is a pair of differential amplifiers. The substrate includes multiple insulating layers arranged in a stacking direction. An electrode to which the surface mount device is soldered is provided on the surface. In a view from the stacking direction, the carrier balun, the electrode, and the peak balun, which are arranged in a second planar direction, are disposed on one side of the integrated circuit in a first planar direction.

20 Claims, 16 Drawing Sheets

POWER AMPLIFICATION DEVICE

CROSS-REFERENCE TO RELATED APPLICATION

This application claims priority to Japanese Patent Application No. JP 2023-127406 filed on Aug. 3, 2023. The entire contents of the above-identified application, including the specifications, drawings and claims, are incorporated herein by reference in their entirety.

BACKGROUND OF THE DISCLOSURE

1. Field of the Disclosure

The present disclosure relates to a power amplification device.

2. Description of the Related Art

As a type of power amplification device, there is a differential amplification device including a differential Doherty circuit. In the differential Doherty circuit, a carrier amplifier and a peak amplifier are connected in parallel with each other. The carrier amplifier operates regardless of the power level of an input signal. The peak amplifier is turned off assuming the power level of an input signal is low and is turned on assuming the power level of an input signal is high. The differential Doherty circuit also includes a carrier balun connected to the carrier amplifier, a peak balun connected to the peak amplifier, and a regulator circuit (a regulator circuit component). Also, as the layout on a substrate, the carrier balun and the peak balun are disposed adjacent to one side surface of an integrated circuit including the carrier amplifier and the peak amplifier. In other words, the carrier balun and the peak balun are disposed adjacent to each other. Furthermore, a surface mount device, such as a regulator circuit component, is attached to the surface of the substrate (see, for example, Japanese Unexamined Patent Application Publication No. 2022-170224).

SUMMARY OF THE DISCLOSURE

Here, assuming the distance between the carrier balun and the peak balun is short, the carrier balun and the peak balun electromagnetically interfere with each other. This may result in characteristic degradation. For this reason, the carrier balun and the peak balun are disposed apart from each other by a predetermined distance or more. However, this creates a dead space between the carrier balun and the peak balun and increases the size of the power amplification device. Therefore, it is desired to reduce the size of the power amplification device by using the dead space.

The present disclosure is made in view of the above-described problem, and one purpose of the present disclosure is to provide a downsized power amplification device.

A power amplification device according to an aspect of the present disclosure includes a substrate having a surface; an integrated circuit including a carrier amplifier and a peak amplifier and disposed on the surface; a carrier balun connected to the carrier amplifier; a peak balun connected to the peak amplifier; and a surface mount device disposed on the surface. Each of the carrier amplifier and the peak amplifier is a pair of differential amplifiers. A stacking direction indicates a direction in which the integrated circuit and the substrate are arranged. A first stacking direction of the stacking direction indicates a direction from the integrated circuit toward the substrate. A first planar direction indicates a direction parallel to the surface. A second planar direction indicates a direction that is parallel to the surface and intersects the first planar direction. The substrate includes multiple insulating layers arranged in the stacking direction. An electrode to which the surface mount device is soldered is provided on the surface. In a view from the stacking direction, the carrier balun, the electrode, and the peak balun, which are arranged in the second planar direction, are disposed on one side of the integrated circuit in the first planar direction. One of the carrier balun and the peak balun is disposed on one of the insulating layers that is located farther in the first stacking direction than one of the insulating layers that forms the surface, and at least a part of the one of the carrier balun and the peak balun overlaps the electrode in the view from the stacking direction.

A power amplification device according to an aspect of the present disclosure includes a substrate having a surface; an integrated circuit including a carrier amplifier and a peak amplifier and disposed on the surface; a carrier balun connected to the carrier amplifier; a peak balun connected to the peak amplifier; and an inductor that is a surface mount device disposed on the surface. Each of the carrier amplifier and the peak amplifier is a pair of differential amplifiers. A stacking direction indicates a direction in which the integrated circuit and the substrate are arranged. A first stacking direction of the stacking direction indicates a direction from the integrated circuit toward the substrate. A first planar direction indicates a direction parallel to the surface. A second planar direction indicates a direction that is parallel to the surface and intersects the first planar direction. The substrate includes multiple insulating layers arranged in the stacking direction. The carrier balun includes a primary carrier balun and a secondary carrier balun each of which includes a winding whose center line extends in the stacking direction. One of the primary carrier balun and the secondary carrier balun is disposed on the surface, and another one of the primary carrier balun and the secondary carrier balun is disposed on one of the insulating layers that is located farther in the first stacking direction than one of the insulating layers that forms the surface. The peak balun includes a primary peak balun and a secondary peak balun each of which includes a winding whose center line extends in the stacking direction. One of the primary peak balun and the secondary peak balun is disposed on the surface, and another one of the primary peak balun and the secondary peak balun is disposed on one of the insulating layers that is located farther in the first stacking direction than the one of the insulating layers that forms the surface. In a view from the stacking direction, the carrier balun, the inductor, and the peak balun, which are arranged in the second planar direction, are disposed on one side of the integrated circuit in the first planar direction. A center line of a winding of the inductor extends in the second planar direction.

A power amplification device according to an aspect of the present disclosure includes a substrate having a surface; an integrated circuit including a carrier amplifier and a peak amplifier and disposed on the surface; a carrier balun connected to the carrier amplifier; a peak balun connected to the peak amplifier; and an inductor that is a surface mount device disposed on the surface. Each of the carrier amplifier and the peak amplifier is a pair of differential amplifiers. A stacking direction indicates a direction in which the integrated circuit and the substrate are arranged. A first stacking direction of the stacking direction indicates a direction from the integrated circuit toward the substrate. A first planar direction indicates a direction parallel to the surface. A second planar direction indicates a direction that is parallel to the surface and intersects the first planar direction. The substrate includes multiple insulating layers arranged in the stacking direction. In a view from the stacking direction, the carrier balun, the inductor, and the peak balun, which are arranged in the second planar direction, are disposed on one side of the integrated circuit in the first planar direction. The carrier balun includes a primary carrier balun and a secondary carrier balun that are disposed on different ones of the insulating layers, a center line of a winding of each of the primary carrier balun and the secondary carrier balun extending in the stacking direction. The peak balun includes a primary peak balun and a secondary peak balun that are disposed on different ones of the insulating layers, a center line of a winding of each of the primary peak balun and the secondary peak balun extending in the stacking direction. One of the carrier balun and the peak balun is disposed on one of the insulating layers that is located farther in the first stacking direction than one of the insulating layers that forms the surface. A center line of a winding of the inductor extends in the second planar direction.

The present disclosure makes it possible to reduce the size of a power amplification device.

DESCRIPTION OF THE PREFERRED EMBODIMENTS

Power amplification devices according to embodiments of the present disclosure are described in detail below with reference to the drawings. However, the present disclosure is not limited to the embodiments. Needless to say, the embodiments are examples, and partial substitutions and combinations of components in different embodiments may be made. In the third and subsequent variations, the descriptions of features identical with those of the first embodiment are omitted, and only differences are described. In particular, the description of the same effect provided by the same feature is not repeated for each embodiment.

First, an overall configuration of a power amplification device 100 is described, and then the details of a differential Doherty circuit are described. In the power amplification device 100 of the present disclosure, a carrier amplifier includes a pair of differential amplifiers 13*a* and 13*b* and a peak amplifier includes a pair of differential amplifiers 17*a* and 17*b* (see FIG. 6). However, to simplify the description, an example of the overall configuration of the power amplification device 100 is described using a single-ended carrier amplifier 13 and a single-ended peak amplifier 17 instead of pairs of differential amplifiers.

First Embodiment

Figure 1:
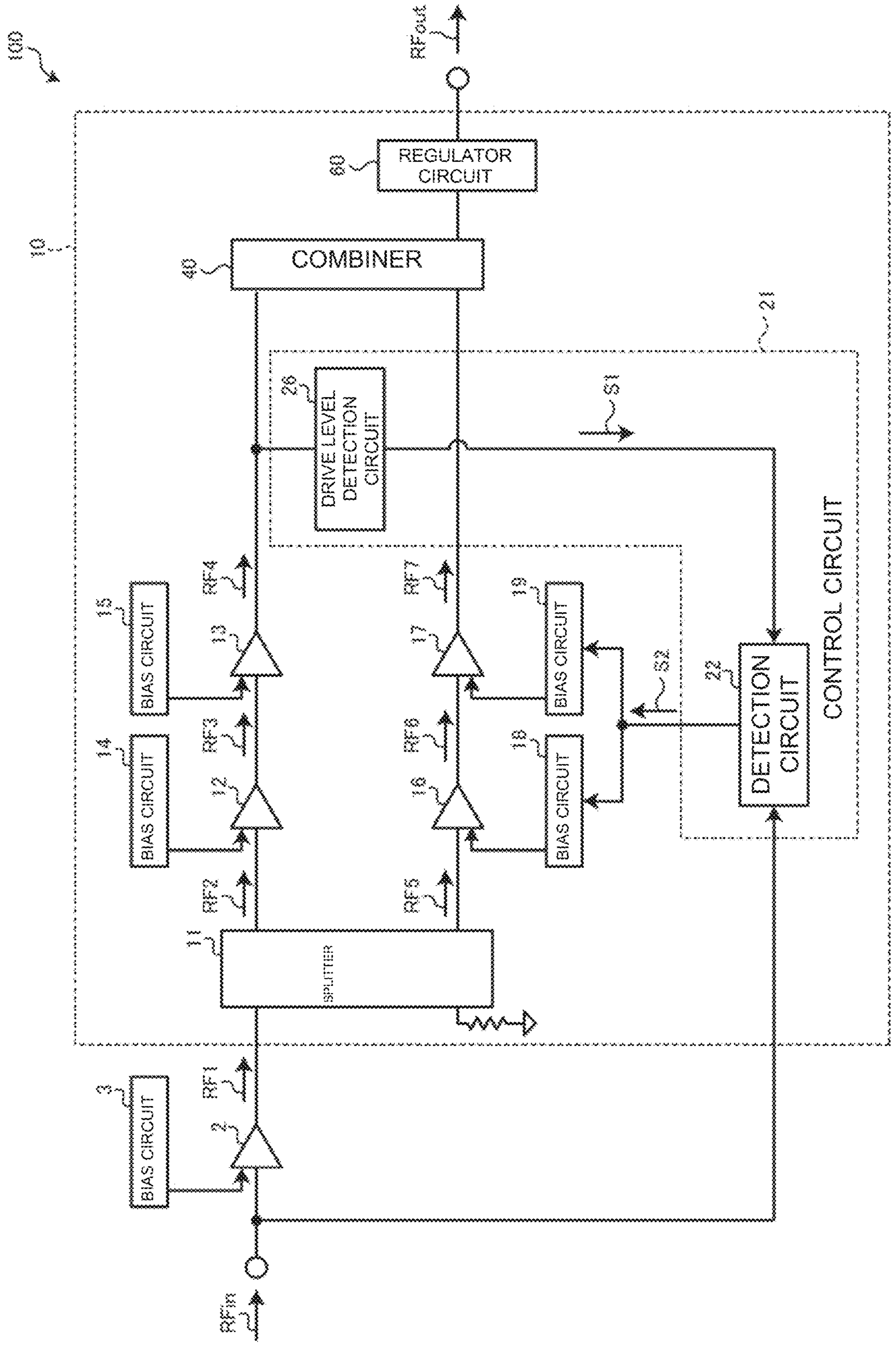
FIG. 1 is a diagram illustrating an overall circuit configuration of a power amplification device according to a first embodiment.

FIG. 1 illustrates an overall circuit configuration of a power amplification device according to a first embodiment. A power amplification device 100 includes a power amplifier circuit 1. The power amplifier circuit 1 includes an amplifier 2, a bias circuit 3, and a Doherty amplifier circuit 10. The Doherty amplifier circuit 10 includes a splitter 11, a first stage (driver stage) carrier amplifier 12, a final stage (power stage) carrier amplifier 13, a bias circuit 14, a bias circuit 15, a first stage (driver stage) peak amplifier 16, a final stage (power stage) peak amplifier 17, a bias circuit 18, a bias circuit 19, a combiner 40, a control circuit 21, and a regulator circuit 60.

The control circuit 21 includes a detection circuit 22 and a drive level detection circuit 26. Although the number of stages of the Doherty amplifier circuit 10 is two in this example, the present disclosure is not limited to this example. The number of stages of the Doherty amplifier circuit 10 may be one or three or more.

The bias circuit 3 applies a bias to the amplifier 2. A radio frequency signal RF (Radio-Frequency) is input to the amplifier 2. The frequency of the radio frequency signal RFin is, for example, about several GHz. The amplifier 2 amplifies the input radio frequency signal RFin. Then, the amplifier 2 outputs an amplified radio frequency signal RF1 to the splitter 11. In the descriptions below, a radio frequency signal RF may be simply referred to as a signal RF.

The splitter 11 is a 90-degree hybrid circuit. The 90-degree hybrid circuit divides the radio frequency signal RF1 into a radio frequency signal RF2 and a radio frequency signal RF5 whose phases are different from each other by approximately 90°, outputs the radio frequency signal RF2 to the carrier amplifier 12, and outputs the radio frequency signal RF5 to the peak amplifier 16. Here, "approximately 90°" indicates not only the phase of 90° but also a phase greater than or equal to 45° and less than or equal to 135°. Also, the phase of the radio frequency signal RF2 is behind the radio frequency signal RF5 by 90°. The power of the radio frequency signal RF2 and the power of the radio frequency signal RF5 are the same.

The bias circuit 14 applies a bias to the carrier amplifier 12. The bias circuit 15 applies a bias to the carrier amplifier 13. The carrier amplifier 12 outputs a radio frequency signal RF3 obtained by amplifying the radio frequency signal RF2 to the carrier amplifier 13. The carrier amplifier 13 outputs a radio frequency signal RF4 obtained by amplifying the radio frequency signal RF3 to the combiner 40.

The bias circuit 18 applies a bias to the peak amplifier 16. The bias circuit 19 applies a bias to the peak amplifier 17. The peak amplifier 16 outputs a radio frequency signal RF6 obtained by amplifying the radio frequency signal RF5 to the peak amplifier 17. The peak amplifier 17 outputs a radio frequency signal RF7 obtained by amplifying the radio frequency signal RF6 to the combiner 40.

The combiner 40 combines the radio frequency signal RF4 with the radio frequency signal RF7. Also, the combiner 40 combines the radio frequency signal RF7 with the radio frequency signal RF4 such that the phase of the radio frequency signal RF7 is behind the phase of the radio frequency signal RF4 by 90°. The regulator circuit 60 matches the impedance between the output end of each of the carrier amplifier 13 and the peak amplifier 17 and the output terminal of the power amplifier circuit 1. Details of the combiner 40 and the regulator circuit 60 are described later.

The drive level detection circuit 26 outputs a signal S1, which represents the drive level (or an operation level) of the carrier amplifier 13, to the detection circuit 22 based on the radio frequency signal RF4 output by the carrier amplifier 13.

The radio frequency signal RFin and the signal S1 are input to the detection circuit 22. In the present disclosure, the radio frequency signal RF1 or the radio frequency signal RF2 may be input to the detection circuit 22 instead of the radio frequency signal RFin.

Based on the radio frequency signal RFin and the signal S1, the detection circuit 22 outputs, to the bias circuits 18 and 19, a signal S2 for controlling the bias circuits 18 and 19. Based on the signal S2, the bias circuit 18 applies a bias to the peak amplifier 16. Based on the signal S2, the bias circuit 19 applies a bias to the peak amplifier 17. That is, the detection circuit 22 controls biases applied by the peak amplifier 16 and the peak amplifier 17 based on the radio frequency signal RFin and the signal S1.

Figure 2:
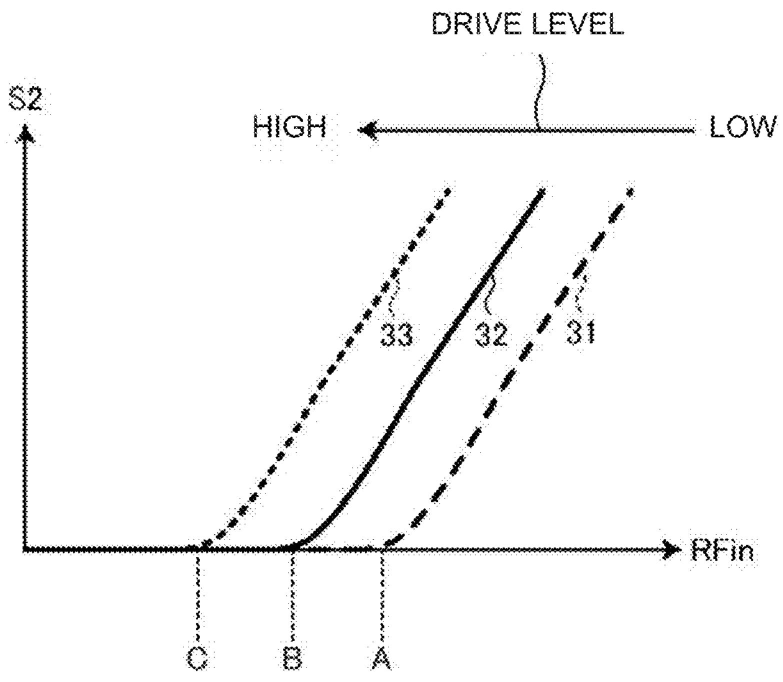
FIG. 2 is a graph showing an example of a relationship between the power of a radio frequency signal of a power amplifier circuit according to the first embodiment and a signal output by a detection circuit.

FIG. 2 is a graph illustrating an example of a relationship between the power of a radio frequency signal of the power amplifier circuit of the first embodiment and a signal output by the detection circuit. In FIG. 2, the horizontal axis represents the power of the radio frequency signal RFin, and the vertical axis represents the signal S2 output by the detection circuit 22.

The detection circuit 22 varies the rise point of the signal S2 according to the signal S1. Here, the rise point of the signal S2 may be referred to as a threshold. A waveform 31 indicates a relationship between the power of the radio frequency signal RFin and the signal S2 assuming the drive level of the carrier amplifier 13 is relatively low. A waveform 32 indicates a relationship between the power of the radio frequency signal RFin and the signal S2 assuming the drive level of the carrier amplifier 13 is relatively intermediate. A waveform 33 indicates a relationship between the power of the radio frequency signal RFin and the signal S2 assuming the drive level of the carrier amplifier 13 is relatively high.

In a case where the drive level of the carrier amplifier 13 is relatively low, the detection circuit 22 causes the signal S2 to start to rise assuming the power of the radio frequency signal RFin reaches a value A as indicated by the waveform 31. Assuming the power of the radio frequency signal RFin is in a range greater than or equal to the value A, the detection circuit 22 increases the signal S2 as the power of the radio frequency signal RFin increases.

In a case where the drive level of the carrier amplifier 13 is relatively intermediate, the detection circuit 22 causes the signal S2 to start to rise assuming the power of the radio frequency signal RFin reaches a value B (B<A) as indicated by the waveform 32. Assuming the power of the radio frequency signal RFin is in a range greater than or equal to the value B, the detection circuit 22 increases the signal S2 as the power of the radio frequency signal RFin increases.

In a case where the drive level of the carrier amplifier 13 is relatively high, the detection circuit 22 causes the signal S2 to start to rise assuming the power of the radio frequency signal RFin reaches a value C (C<B) as indicated by the waveform 33. Assuming the power of the radio frequency signal RFin is in a range greater than or equal to the value C, the detection circuit 22 increases the signal S2 as the radio frequency signal RFin increases.

Assuming the radio frequency signal RFin with a large power, which is the main cause of saturating the carrier amplifiers 12 and 13, is input, the detection circuit 22 outputs the signal S2 to the bias circuits 18 and 19 to cause the bias circuits 18 and 19 to activate the peak amplifiers 16 and 17. This essentially prevents the carrier amplifiers 12 and 13 from being saturated.

What is important here is the response speed of the detection circuit 22. The detection circuit 22 detects the radio frequency signal RFin and can therefore respond much faster compared with the related art in which the saturation of carrier amplifiers is detected. Therefore, even assuming the power of the radio frequency signal RFin increases in a short period of time, the detection circuit 22 can respond quickly to cause the bias circuits 18 and 19 to activate the peak amplifiers 16 and 17 without causing the carrier amplifiers 12 and 13 to be saturated even momentarily.

On the other hand, assuming the temperature or any other surrounding environment changes (for example, assuming the gains of the carrier amplifiers 12 and 13 increase due to an extremely low temperature), the carrier amplifiers 12 and 13 may be saturated even assuming the power of the radio frequency signal RFin is low. To be able to deal with such a situation, the detection circuit 22 detects the signal S1 representing the drive level of the carrier amplifiers 12 and 13 and immediately activates the peak amplifiers 16 and 17 assuming the carrier amplifiers 12 and 13 are close to saturation even assuming the power of the radio frequency signal RFin is low.

Because the detection circuit 22 detects the radio frequency signal RFin, the detection circuit 22 can cause the bias circuits 18 and 19 to activate the peak amplifiers 16 and 17 without causing the carrier amplifiers 12 and 13 to be saturated even assuming a significant amount of time is preferable to detect the drive level of the carrier amplifiers

12 and 13. This enables the Doherty amplifier circuit 10 to suppress the decline in the quality of a radio frequency signal RFout.

It can be considered that the detection circuit 22 operates in a feedforward manner in response to the radio frequency signal RFin and operates in a feedback manner in response to the signal S1. Although the signal S2 for controlling the bias circuits 18 and 19 is output to each of the bias circuits 18 and 19 in the present embodiment, the present disclosure is not limited to this embodiment, and the signal S2 may be output to one or both of the bias circuits 18 and 19.

Examples of Detection Circuit and Drive Level Detection Circuit

Figure 3:
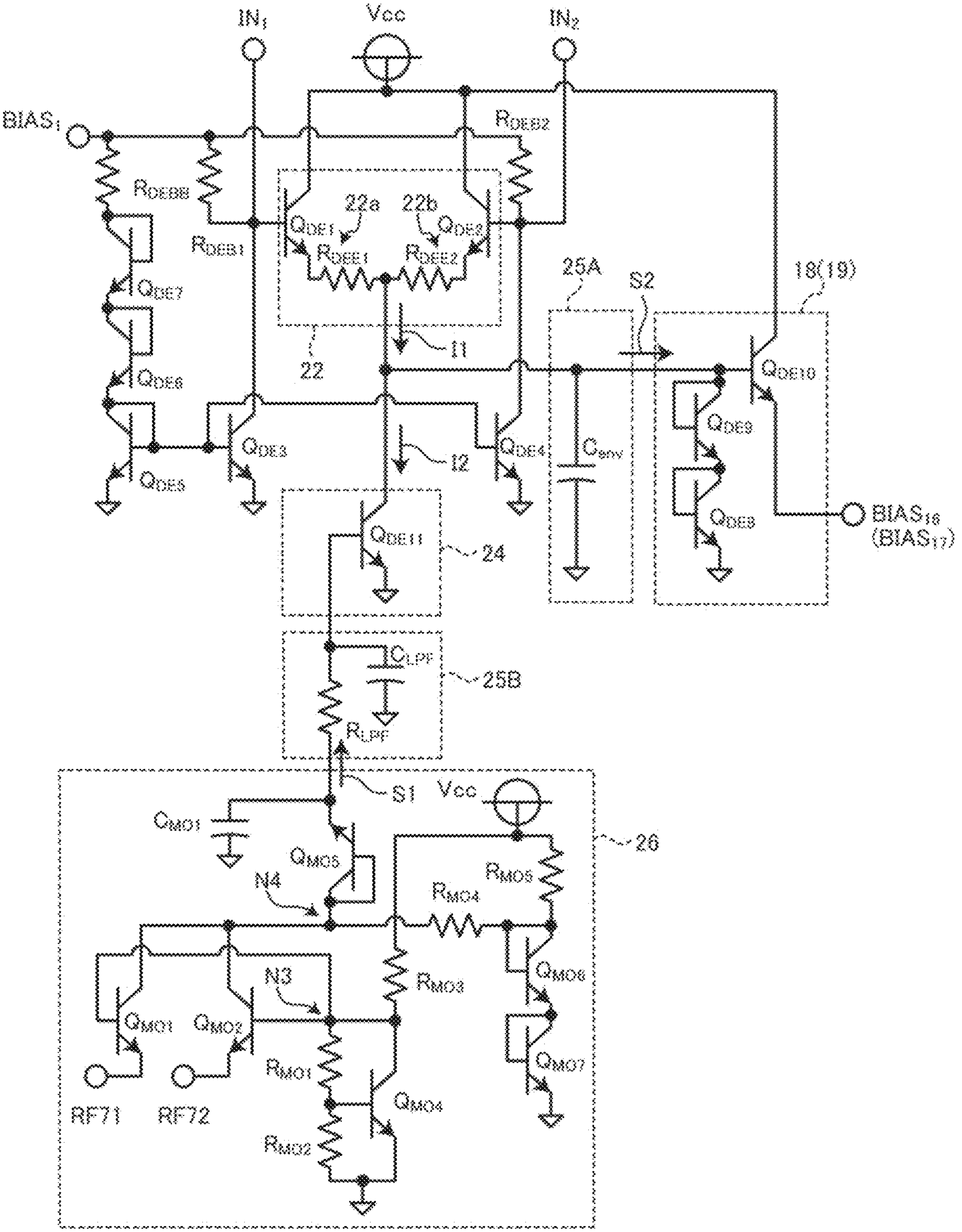
FIG. 3 is a diagram illustrating examples of a detection circuit and a drive level detection circuit of the power amplifier circuit according to the first embodiment.

FIG. 3 is a diagram illustrating examples of the detection circuit and the drive level detection circuit of the power amplifier circuit according to the first embodiment. FIG. 3 also illustrates a circuit element for applying a bias to the detection circuit 22. A low pass filter 25A and the bias circuits 18 and 19 illustrated in FIG. 3 may be omitted. The low pass filter 25A can be omitted in, for example, a condition in which a good differential signal can be obtained. The bias circuits 18 and 19 may be omitted assuming biased transistors (or amplifier transistors) are small.

The detection circuit 22 includes transistors $Q_{DE1}$ and $Q_{DE2}$ and resistors $R_{DEE1}$ and $R_{DEE2}$.

In the present embodiment, each transistor is a bipolar transistor. However, the present disclosure is not limited to the present embodiment. An example of the bipolar transistor is a heterojunction bipolar transistor (HBT). However, the present disclosure is not limited to this example. Each transistor may instead be, for example, a field-effect transistor (FET). Each transistor may also be a multi-finger transistor including multiple unit transistors that are electrically connected in parallel with each other. A unit transistor refers to a transistor with the minimum configuration.

The collector of the transistor $Q_{DE1}$ is electrically connected to a power supply potential Vcc. The emitter of the transistor $Q_{DE1}$ is electrically connected to a first end of the resistor $R_{DEE1}$. In other words, the transistor $Q_{DE1}$ is connected to the resistor $R_{DEE1}$ in an emitter-follower configuration. The transistor $Q_{DE1}$ and the resistor $R_{DEE1}$ constitute a first emitter follower circuit 22*a*.

The detection circuit 22 may include a source follower circuit in place of the first emitter follower circuit 22*a*.

The collector of the transistor $Q_{DE2}$ is electrically connected to the power supply potential Vcc. The emitter of the transistor $Q_{DE2}$ is electrically connected to a first end of the resistor $R_{DEE2}$. In other words, the transistor $Q_{DE2}$ is connected to the resistor $R_{DEE2}$ in an emitter-follower configuration. The transistor $Q_{DE2}$ and the resistor $R_{DEE2}$ constitute a second emitter follower circuit 22*b*.

The detection circuit 22 may include a source follower circuit in place of the second emitter follower circuit 22*b*.

A second end of the resistor $R_{DEE1}$ and a second end of the resistor $R_{DEE2}$ are electrically connected to each other. The sum of the output current of the first emitter follower circuit 22*a* and the output current of the second emitter follower circuit 22*b* is an output current I1 of the detection circuit 22.

Resistors $R_{DEBB}$, $R_{DEB1}$, and $R_{DEB2}$ and transistors $Q_{DE5}$, $Q_{DE6}$, and $Q_{DE7}$ apply bias voltages to the bases of the transistors $Q_{DE1}$ and $Q_{DE2}$.

A first end of the resistor $R_{DEBB}$, a first end of the resistor $R_{DEB1}$, and a first end of the resistor $R_{DEB2}$ are electrically connected to each other.

A second end of the resistor $R_{DEBB}$ is electrically connected to the collector and the base of the transistor $Q_{DE7}$. In other words, the transistor $Q_{DE7}$ is diode-connected. The emitter of the transistor $Q_{DE7}$ is electrically connected to the collector and the base of the transistor $Q_{DE6}$. In other words, the transistor $Q_{DE6}$ is diode-connected. The emitter of the transistor $Q_{DE6}$ is electrically connected to the collector and the base of the transistor $Q_{DE5}$. In other words, the transistor $Q_{DE5}$ is diode-connected. The emitter of the transistor $Q_{DE5}$ is electrically connected to a reference potential GND. The reference potential GND is, for example, a ground potential. However, the present disclosure is not limited to this example.

A bias current $BIAS_1$ is input to the first end of the resistor $R_{DEBB}$, the first end of the resistor $R_{DEB1}$, and the first end of the resistor $R_{DEB2}$. The resistor $R_{DEBB}$, the transistor $Q_{DE7}$, the transistor $Q_{DE6}$, and the transistor $Q_{DE5}$ generate a constant voltage. This voltage is input via the resistor $R_{DEB1}$ to the base of the transistor $Q_{DE1}$ and is also input via the resistor $R_{DEB2}$ to the base of the transistor $Q_{DE2}$.

Each of transistors $Q_{DE3}$ and $Q_{DE4}$ is connected to the transistor $Q_{DE5}$ in a current mirror configuration. The collector of the transistor $Q_{DE3}$ is electrically connected to the base of the transistor $Q_{DE1}$. This enables the transistor $Q_{DE3}$ to adjust the base current of the transistor $Q_{DE1}$. The collector of the transistor $Q_{DE4}$ is electrically connected to the base of the transistor $Q_{DE2}$. This enables the transistor $Q_{DE4}$ to adjust the base current of the transistor $Q_{DE2}$.

Radio frequency signals $IN_1$ and $IN_2$, which are obtained by converting the radio frequency signal RFin into differential signals, are input to the base of the transistor $Q_{DE1}$ and the base of the transistor $Q_{DE2}$, respectively. The radio frequency signals $IN_1$ and $IN_2$ can be obtained by, for example, inputting the radio frequency signal RFin to a balun.

The second end of the resistor $R_{DEE1}$ and the second end of the resistor $R_{DEE2}$ are electrically connected to a constant-current circuit 24. The constant-current circuit 24 includes a transistor $Q_{DE11}$. The constant-current circuit 24 is a current bias circuit for the detection circuit 22.

The drive level detection circuit 26 includes resistors $R_{MO1}$, $R_{MO2}$, $R_{MO3}$, $R_{MO4}$, and $R_{MO5}$, transistors $Q_{MO1}$, $Q_{MO2}$, $Q_{MO4}$, $Q_{MO5}$, $Q_{MO6}$, and $Q_{MO7}$, and a capacitor $C_{MO1}$.

In the descriptions below, it is assumed that the carrier amplifier 13 (see FIG. 1) is a pair of differential amplifiers and outputs radio frequency signals RF71 and RF72 constituting a pair of differential signals.

The radio frequency signal RF71 is input to the emitter of the transistor $Q_{MO1}$. In this example, the emitter of the transistor $Q_{MO1}$ is electrically connected to the output terminal (the collector or the drain of an output transistor) of one of the amplifiers constituting the carrier amplifier 13.

The radio frequency signal RF72 is input to the emitter of the transistor $Q_{MO2}$. In this example, the emitter of the transistor $Q_{MO2}$ is electrically connected to the output terminal (the collector or the drain of an output transistor) of the other one of the amplifiers constituting the carrier amplifier 13.

The base of the transistor $Q_{MO1}$ and the base of the transistor $Q_{MO2}$ are electrically connected to a node N3. The collector of the transistor $Q_{MO1}$ and the collector of the transistor $Q_{MO2}$ are electrically connected to a node N4.

The resistors $R_{MO1}$, $R_{MO2}$, and $R_{MO3}$ and the transistor $Q_{MO4}$ apply a voltage to the node N3. That is, the resistors $R_{MO1}$, $R_{MO2}$, and $R_{MO3}$ and the transistor $Q_{MO4}$ apply a bias to each of the base of the transistor $Q_{MO1}$ and the base of the transistor $Q_{MO2}$.

A first end of the resistor $R_{MO3}$ is electrically connected to the power supply potential Vcc. A second end of the resistor $R_{MO3}$ is electrically connected to the node N3, the collector of the transistor $Q_{MO4}$, and a first end of the resistor $R_{MO1}$. A second end of the resistor $R_{MO1}$ is electrically connected to the base of the transistor $Q_{MO4}$ and a first end of the resistor $R_{MO2}$. The emitter of the transistor $Q_{MO4}$ and a second end of the resistor $R_{MO2}$ are electrically connected to the reference potential GND. The resistors $R_{MO1}$ and $R_{MO2}$ and the transistor $Q_{MO4}$ generate a constant voltage. This voltage corresponds to the voltage of the node N3.

The resistors $R_{MO4}$ and $R_{MO5}$ and the transistors $Q_{MO6}$ and $Q_{MO7}$ apply a voltage to the node N4. That is, the resistors $R_{MO4}$ and $R_{MO5}$ and the transistors $Q_{MO6}$ and $Q_{MO7}$ apply a bias to each of the collector of the transistor $Q_{MO1}$ and the collector of the transistor $Q_{MO2}$.

A first end of the resistor $R_{MO5}$ is electrically connected to the power supply potential Vcc. A second end of the resistor $R_{MO5}$ is electrically connected to the collector and the base of the transistor $Q_{MO6}$. That is, the transistor $Q_{MO6}$ is diode-connected. The emitter of the transistor $Q_{MO6}$ is electrically connected to the collector and the base of the transistor $Q_{MO7}$. That is, the transistor $Q_{MO7}$ is diode-connected. The emitter of the transistor $Q_{MO7}$ is electrically connected to the reference potential GND. A first end of the resistor $R_{MO4}$ is electrically connected to the second end of the resistor $R_{MO5}$ and the collector and the base of the transistor $Q_{MO6}$. A second end of the resistor $R_{MO4}$ is electrically connected to the node N4. The transistors $Q_{MO6}$ and $Q_{MO7}$ generate a constant voltage. This voltage becomes the voltage of the node N4 via the resistor $R_{MO4}$.

The collector and the base of the transistor $Q_{MO5}$ are electrically connected to the node N4. That is, the transistor $Q_{MO5}$ is diode-connected. The emitter of the transistor $Q_{MO5}$ is electrically connected to a first end of the capacitor $C_{MO1}$. A second end of the capacitor $C_{MO1}$ is electrically connected to the reference potential GND.

The transistor $Q_{MO5}$ outputs the signal S1 from the emitter. In other words, in the present embodiment, the emitter voltage of the transistor $Q_{MO5}$ corresponds to the signal S1. The capacitor $C_{MO1}$ shunts a radio frequency component of the signal S1 to smooth the signal S1.

The resistors $R_{MO1}$, $R_{MO2}$, and $R_{MO3}$ and the transistor $Q_{MO4}$ are able to output a substantially constant voltage and therefore may be replaced with a constant voltage source. The resistor $R_{MO5}$ and the transistors $Q_{MO6}$ and $Q_{MO7}$ are able to output a substantially constant voltage and therefore may be replaced with a constant voltage source. The transistor $Q_{MO5}$ causes a substantially constant voltage drop and may therefore be replaced with a constant voltage source.

A low pass filter 25B includes a resistor $R_{LPF}$ and a capacitor $C_{LPF}$.

A first end of the resistor $R_{LPF}$ is electrically connected to the emitter of the transistor $Q_{MO5}$. A second end of the resistor $R_{LPF}$ is electrically connected to a first end of the capacitor $C_{LPF}$. A second end of the capacitor $C_{LPF}$ is electrically connected to the reference potential GND.

The second end of the resistor $R_{LPF}$ and the first end of the capacitor $C_{LPF}$ are electrically connected to the base of a transistor $Q_{DE11}$. The low pass filter 25B passes the signal S1 in a low frequency range and outputs the signal S1 to the base of the transistor $Q_{DE11}$.

The low pass filter 25A includes a capacitor $C_{env}$. A first end of the capacitor $C_{env}$ is electrically connected to the second end of the resistor $R_{DEE1}$, the second end of the resistor $R_{DEE2}$, and the collector of the transistor $Q_{DE11}$. A second end of the capacitor $C_{env}$ is electrically connected to the reference potential GND.

The capacitor $C_{env}$ is charged or discharged by the difference between the output current I1 of the detection circuit 22 and a collector current 12 of the transistor $Q_{DE11}$. The voltage of the capacitor $C_{env}$ corresponds to the signal S2. The capacitor $C_{env}$ terminates, and thereby removes, a radio frequency component (e.g., a carrier frequency signal component) of the signal S2 to the reference potential GND and passes a low frequency component. With this configuration, the capacitor $C_{env}$ makes it possible to appropriately bias the bias circuits 18 and 19 and transistors (amplifier transistors) to be biased that are disposed downstream of the capacitor $C_{env}$.

The bias circuit 18 includes transistors $Q_{DE8}$, $Q_{DE9}$, and $Q_{DE10}$. Here, because the circuit configuration of the bias circuit 19 (see FIG. 1) is the same as the circuit configuration of the bias circuit 18, descriptions of the bias circuit 19 are omitted.

The transistor $Q_{DE9}$ is diode-connected. The collector and the base of the transistor $Q_{DE9}$ are electrically connected to the first end of the capacitor $C_{env}$. The emitter of the transistor $Q_{DE9}$ is electrically connected to the collector and the base of the transistor $Q_{DE8}$. The transistor $Q_{DE8}$ is diode-connected. The emitter of the transistor $Q_{DE8}$ is electrically connected to the reference potential GND. An electric current corresponding to the voltage of the capacitor $C_{env}$ flows through the transistors $Q_{DE9}$ and $Q_{DE8}$.

The collector of the transistor $Q_{DE10}$ is electrically connected to the power supply potential Vcc. The base of the transistor $Q_{DE10}$ is electrically connected to the collector and the base of the transistor $Q_{DE9}$. The emitter voltage of the transistor $Q_{DE10}$ is output to the peak amplifier 16 (17) as a bias voltage $BIAS_{16}$ ($BIAS_{17}$).

Figure 4:
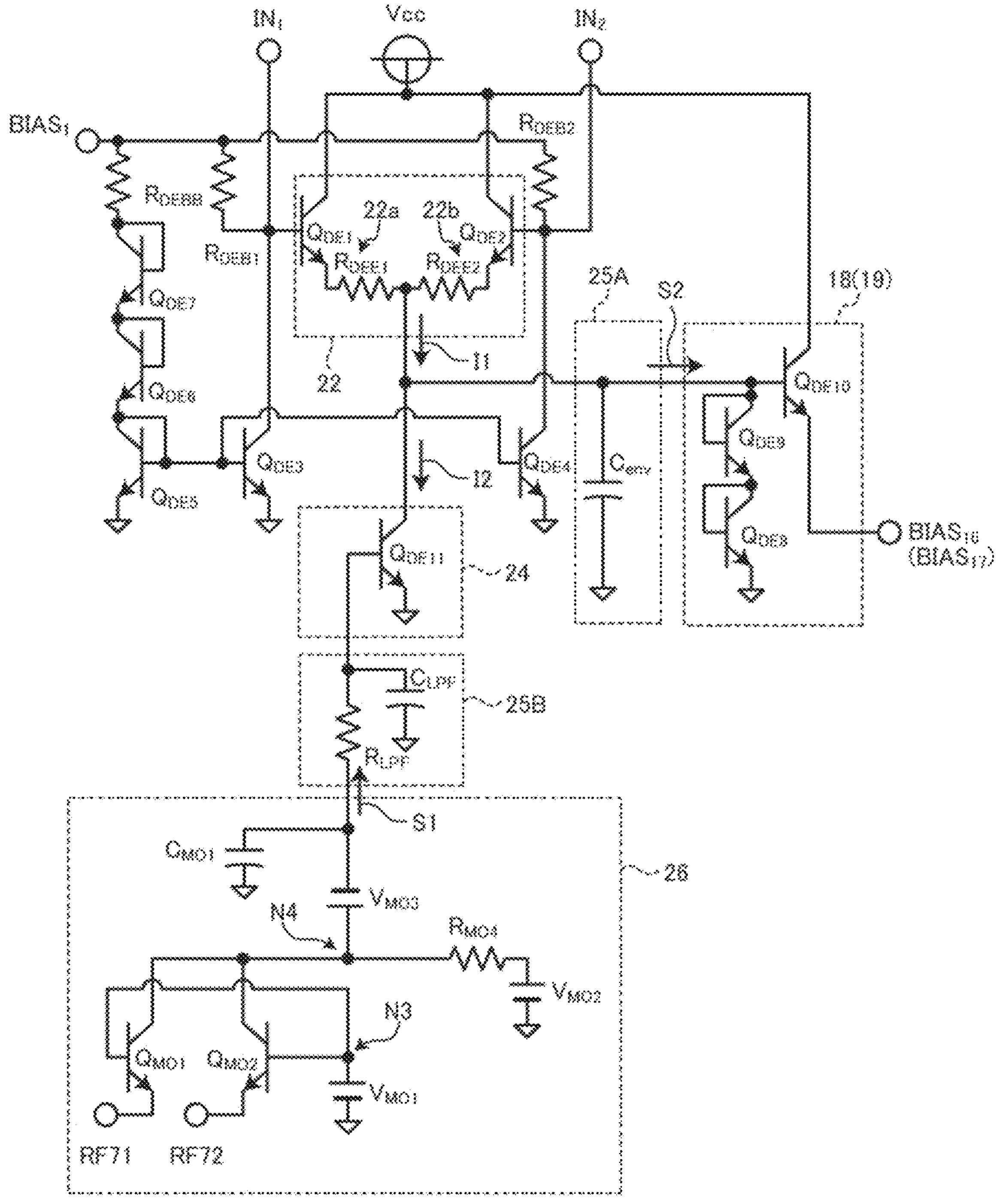
FIG. 4 is a diagram illustrating examples of equivalent circuits of the detection circuit and the drive level detection circuit of the power amplifier circuit according to a fifth embodiment.

FIG. 4 is a diagram illustrating examples of equivalent circuits of the detection circuit and the drive level detection circuit of the power amplifier circuit according to a fifth embodiment. A constant voltage source $V_{MO1}$ in FIG. 4 corresponds to the resistors $R_{MO1}$, $R_{MO2}$, and $R_{MO3}$ and the transistor $Q_{MO4}$ in FIG. 3. A constant voltage source $V_{MO2}$ in FIG. 4 corresponds to the resistor $R_{MO5}$ and the transistors $Q_{MO6}$ and $Q_{MO7}$ in FIG. 3. A constant voltage source $V_{MO3}$ in FIG. 4 corresponds to the transistor $Q_{MO5}$ in FIG. 3.

Operation of Drive Level Detection Circuit

An operation of the drive level detection circuit 26 is described with reference to the equivalent circuit in FIG. 4.

Generally, the output terminal voltage of the carrier amplifier 13 in the final stage oscillates with the voltage amplitude of a radio frequency signal around the bias voltage. Assuming the carrier amplifier 13 in the final stage is saturated, the voltage amplitude of the radio frequency signal increases and becomes substantially the same as the bias voltage. In this situation, within the oscillation period of the radio frequency signal, there is a moment assuming the output terminal voltage comes close to 0 V. This is the moment assuming no amplification effect is obtained and leads to the saturation of an amplifier.

The circuit of the present embodiment uses this principle of saturation to detect the drive level of the carrier amplifier 13.

Specifically, during the period of each of the radio frequency signals RF71 and RF72, each of the transistors $Q_{MO1}$ and $Q_{MO2}$ is turned on for a period in which the voltage of each of the radio frequency signals RF71 and RF72 is lower than a voltage obtained by subtracting a voltage drop corresponding to the threshold voltage of each of the transistors $Q_{MO1}$ and $Q_{MO2}$ from the voltage of the constant voltage source $V_{MO1}$.

Assuming the carrier amplifier 13 is operating with a sufficient margin for saturation, there is no period assuming each of the transistors $Q_{MO1}$ and $Q_{MO2}$ is turned on, and therefore the collector current does not flow. Also, because no electric current flows through the resistor $R_{MO4}$, the resistor $R_{MO4}$ does not cause a voltage drop. Therefore, the voltage of the signal S1 is obtained by subtracting the voltage of the constant voltage source $V_{MO3}$ from the voltage of the constant voltage source $V_{MO2}$.

On the other hand, assuming the amplitude of each of the radio frequency signals RF71 and RF72 increases, there is a period assuming each of the transistors $Q_{MO1}$ and $Q_{MO2}$ is turned on, and the collector current flows. Therefore, an electric current flows through the resistor $R_{MO4}$, and the resistor $R_{MO4}$ causes a voltage drop.

As the amplitude of each of the radio frequency signals RF71 and RF72 further increases, the period for which each of the transistors $Q_{MO1}$ and $Q_{MO2}$ is turned on increases, and a greater amount of collector current flows. As a result, a greater amount of electric current flows through the resistor $R_{MO4}$, and the resistor $R_{MO4}$ causes a greater voltage drop.

Accordingly, as the drive level of the carrier amplifier 13 increases, the voltage of the signal S1 is decreased by a value corresponding to the voltage drop caused by the resistor $R_{MO4}$ from a value observed assuming the radio frequency signals RF71 and RF72 are small signals.

Next, an operation of the detection circuit 22 is described.

The transistor $Q_{DE1}$ is turned on assuming the radio frequency signal $IN_1$ is greater than or equal to a threshold voltage of the transistor $Q_{DE1}$ and outputs an emitter current. The transistor $Q_{DE2}$ is turned on assuming a radio frequency signal $IN_2$ is greater than or equal to a threshold voltage of the transistor $Q_{DE2}$ and outputs an emitter current.

In other words, as the amplitudes of the radio frequency signals $IN_1$ and $IN_2$ increase (or as the power of the radio frequency signal RFin increases), the output current of the detection circuit 22 increases. Also, as the amplitudes of the radio frequency signals $IN_1$ and $IN_2$ decrease (or as the power of the radio frequency signal RFin decreases), the output current of the detection circuit 22 decreases.

On the other hand, as described above, the voltage of the signal S1 becomes relatively low assuming the drive level of the carrier amplifier 13 is relatively high (assuming the carrier amplifier 13 is close to saturation), and the voltage of the signal S1 becomes relatively high assuming the drive level of the carrier amplifier 13 is relatively low (assuming the amplification factor is low).

In other words, as the drive level of the carrier amplifier 13 becomes relatively higher (as the carrier amplifier 13 becomes closer to saturation), the collector current 12 of the transistor $Q_{DE11}$ decreases. Also, as the drive level of the carrier amplifier 13 becomes relatively lower (as the amplification factor decreases), the collector current 12 of the transistor $Q_{DE11}$ increases.

In summary, the voltage of the capacitor $C_{env}$ becomes more likely to become high as the drive level of the carrier amplifier 13 becomes relatively higher (as the carrier amplifier 13 becomes closer to saturation). Also, the voltage of the capacitor $C_{env}$ becomes less likely to become high as the drive level of the carrier amplifier 13 becomes relatively lower (as the amplification factor decreases). Also, the voltage of the capacitor $C_{env}$ becomes more likely to become high as the power of the radio frequency signal RFin increases. Furthermore, the voltage of the capacitor $C_{env}$ becomes less likely to become high as the power of the radio frequency signal RFin decreases.

Figure 5:
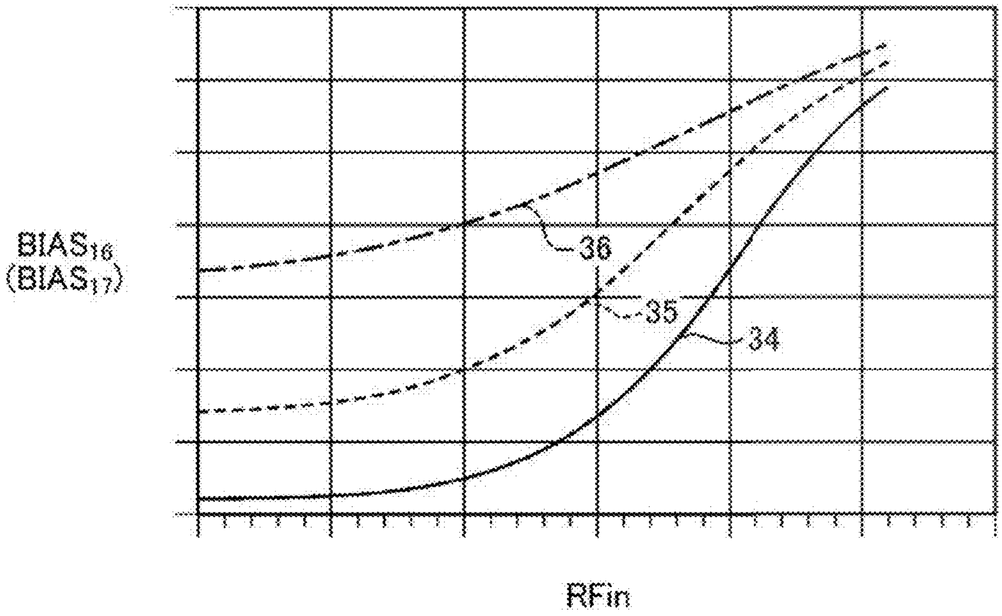
FIG. 5 is a graph showing an example of a relationship between the power of a radio frequency signal of the power amplifier circuit according to the first embodiment and a bias voltage applied to a peak amplifier.

FIG. 5 is a graph showing an example of a relationship between the power of a radio frequency signal of the power amplifier circuit according to the first embodiment and a bias voltage applied to the peak amplifier. In FIG. 5, the horizontal axis represents the power of the radio frequency signal RFin, and the vertical axis represents the bias voltage $BIAS_{16}$ ($BIAS_{17}$) applied by the bias circuit 18 (19) to the peak amplifier 16 (17).

A waveform 34 indicates changes in the bias voltage $BIAS_{16}$ ($BIAS_{17}$) assuming the drive level of the carrier amplifier 13 is relatively low. A waveform 35 indicates changes in the bias voltage $BIAS_{16}$ ($BIAS_{17}$) assuming the drive level of the carrier amplifier 13 is relatively intermediate. A waveform 36 indicates changes in the bias voltage $BIAS_{16}$ ($BIAS_{17}$) assuming the drive level of the carrier amplifier 13 is relatively high.

As indicated by the waveform 36, assuming the drive level of the carrier amplifier 13 is relatively high, the detection circuit 22 can activate the peak amplifiers 16 and 17 even assuming the power of the radio frequency signal RFin is low. On the other hand, as indicated by the waveform 34, assuming the drive level of the carrier amplifier 13 is relatively low, the detection circuit 22 can delay the activation of the peak amplifiers 16 and 17 until the power of the radio frequency signal RFin becomes high.

Therefore, assuming the drive level of the carrier amplifier 13 is relatively high (assuming the carrier amplifier 13 is close to saturation), the electric current of the constant-current circuit 24 is preferably reduced so that the peak amplifiers 16 and 17 can be activated even assuming the power of the radio frequency signal RFin is low. On the other hand, assuming the drive level of the carrier amplifier 13 is relatively low, the electric current of the constant-current circuit 24 is preferably increased because there is no need to activate the peak amplifiers 16 and 17 until the power of the radio frequency signal RFin becomes high. In other words, the intended operation of the entire circuit can be achieved by changing a voltage $BIAS_2$, which is input to the constant-current circuit 24, to compliment the drive level of the carrier amplifier 13.

The response of the detection circuit 22 becomes faster for the reasons described below.

First, the first emitter follower circuit 22*a* and the second emitter follower circuit 22*b* operate differentially. Therefore, the capacitance of the capacitor $C_{env}$ can be reduced compared with a case in which an emitter follower circuit operates in a single-ended manner. This makes it possible to reduce the delay caused by the capacitor $C_{env}$ and thereby change the signal S2 faster. That is, the response of the detection circuit 22 becomes faster.

Second, an emitter follower circuit can output a large amount of electric current. Therefore, each of the first emitter follower circuit 22*a* and the second emitter follower circuit 22*b* can output a large electric current. That is, the detection circuit 22 can output a large output current I1. This enables the detection circuit 22 to charge the capacitor $C_{env}$ at high speed. In other words, the rising response of the detection circuit 22 becomes faster.

Third, the transistor $Q_{DE11}$ can discharge the capacitor $C_{env}$ with a constant electric current (the collector current 12). Therefore, the transistor $Q_{DE11}$ can discharge the capacitor $C_{env}$ at high speed. That is, the falling response of the detection circuit 22 becomes faster.

Figure 6:
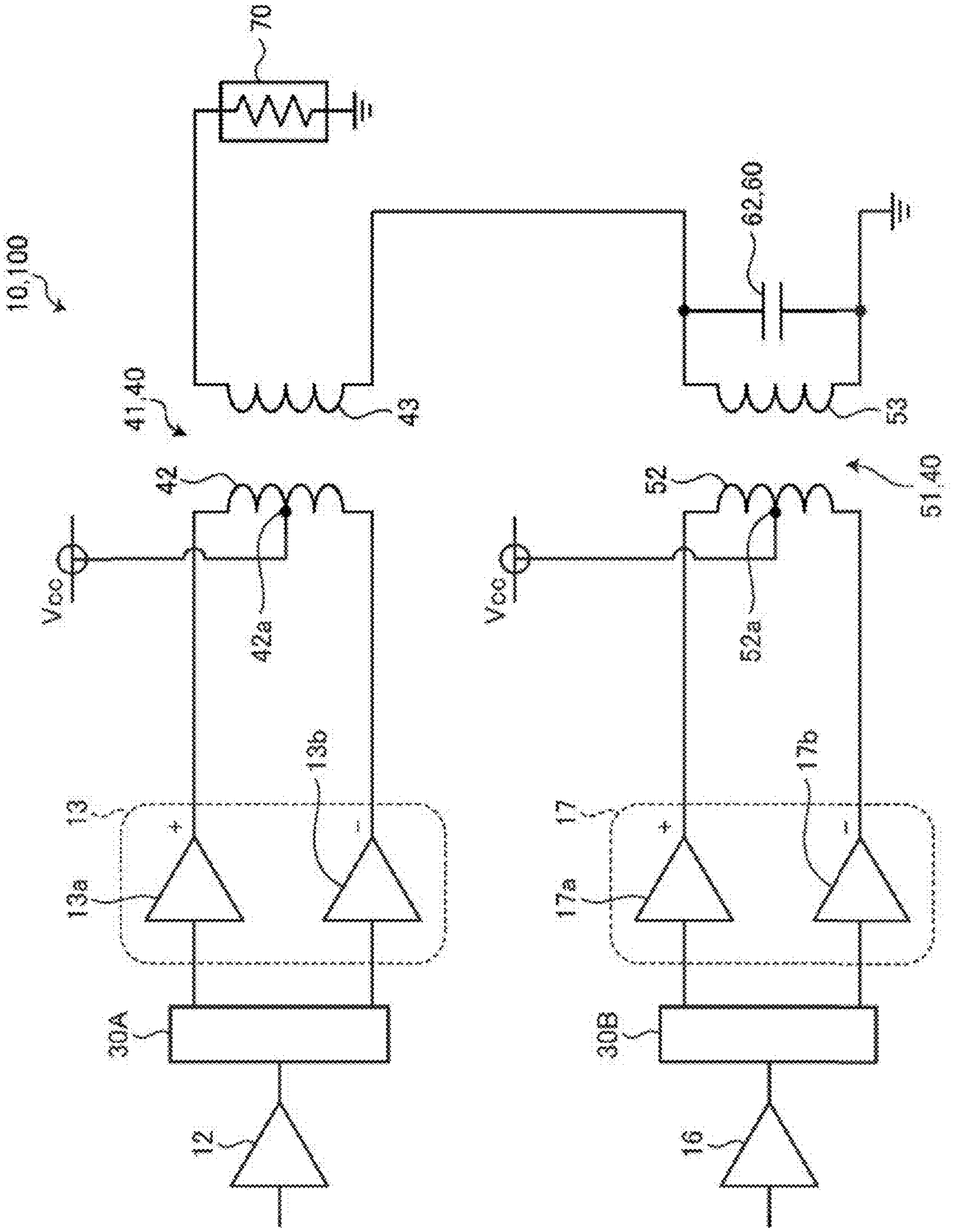
FIG. 6 is a diagram illustrating a circuit configuration of a Doherty circuit of the power amplification device according to the first embodiment.

FIG. 6 is a diagram illustrating a circuit configuration of a Doherty circuit of the power amplification device according to the first embodiment. Next, details of the Doherty amplifier circuit 10 of the first embodiment are described. As illustrated in FIG. 6, the Doherty amplifier circuit 10 of the power amplification device 100 includes two splitters 30A and 30B, a pair of differential amplifiers 13*a* and 13*b*, a pair of differential amplifiers 17*a* and 17*b*, a combiner 40 (a carrier balun 41 and a peak balun 51), a regulator circuit 60, and a load (or an antenna) 70.

The splitter 30A divides the radio frequency signal RF3 (see FIG. 1), which is output from the carrier amplifier 12 (see FIG. 1), into two signals and outputs the signals to the pair of differential amplifiers 13*a* and 13*b*. The splitter 30B divides the radio frequency signal R6 (see FIG. 1), which is output from the peak amplifier 16 (see FIG. 1), into two signals and outputs the signals to the pair of differential amplifiers 17*a* and 17*b*.

The pair of differential amplifiers 13*a* and 13*b* constitute the carrier amplifier 13 (see FIG. 1). The pair of differential amplifiers 17*a* and 17*b* constitute the peak amplifier 17 (see FIG. 1). In the present disclosure, each differential amplifier may be, for example, but is not limited to, a bipolar transistor, such as a heterojunction bipolar transistor (HBT), or a field-effect transistor, such as a metal-oxide-semiconductor field effect transistor (MOSFET).

The combiner 40 includes a carrier balun 41 and a peak balun 51. The carrier balun 41 includes a primary carrier balun 42 and a secondary carrier balun 43 that is magnetically coupled with the primary carrier balun 42. The ends of the primary carrier balun 42 are connected to the pair of differential amplifiers 13*a* and 13*b*. The power supply potential Vcc is supplied to a midpoint 42*a* of the primary carrier balun 42.

The peak balun 51 includes a primary peak balun 52 and a secondary peak balun 53 that is magnetically coupled with the primary peak balun 52. The ends of the primary peak balun 52 are connected to the pair of differential amplifiers 17*a* and 17*b*. The power supply potential Vcc is supplied to a midpoint 52*a* of the primary peak balun 52.

A first end of the secondary peak balun 53 is connected to the reference potential GND. A second end of the secondary peak balun 53 is connected to a first end of the secondary carrier balun 43. Accordingly, the secondary carrier balun 43 and the secondary peak balun 53 are connected in series with each other.

The regulator circuit 60 of the first embodiment includes a capacitor 62. The capacitor 62 is a regulator circuit component of the present embodiment and corresponds to a surface mount device. A second end of the secondary carrier balun 43 is connected to the load (or antenna) 70. A first end of the capacitor 62 is connected to the first end of the secondary carrier balun 43, and a second end of the capacitor 62 is connected to the reference potential GND. Thus, the capacitor 62 is connected in parallel with the secondary peak balun 53.

According to the present embodiment, the phase of the radio frequency signal RF7 (see FIG. 1), which is input from the primary peak balun 52 to the secondary peak balun 53, is delayed by 90° by the capacitor 62. Then, the radio frequency signal RF7 is combined with the radio frequency signal RF4 (see FIG. 1) input to the secondary carrier balun 43. Also, the radio frequency signal RFout (see FIG. 1) formed by the combination is output as an electromagnetic wave from the load (or antenna) 70. Next, a layout of the power amplification device 100 of the first embodiment is described.

Figure 7:
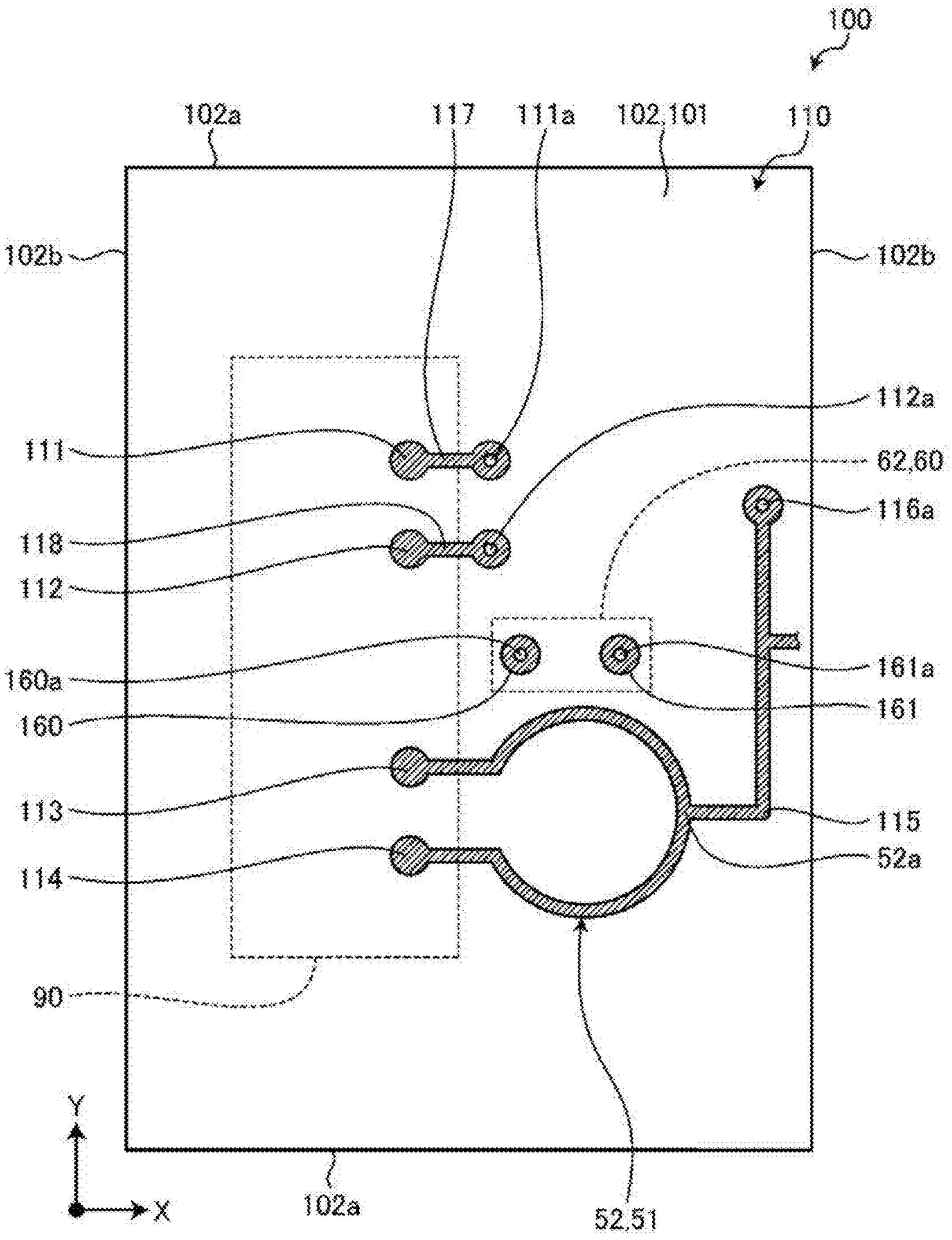
FIG. 7 is a plan view of a surface of a substrate in the power amplification device according to the first embodiment.
Figure 8:
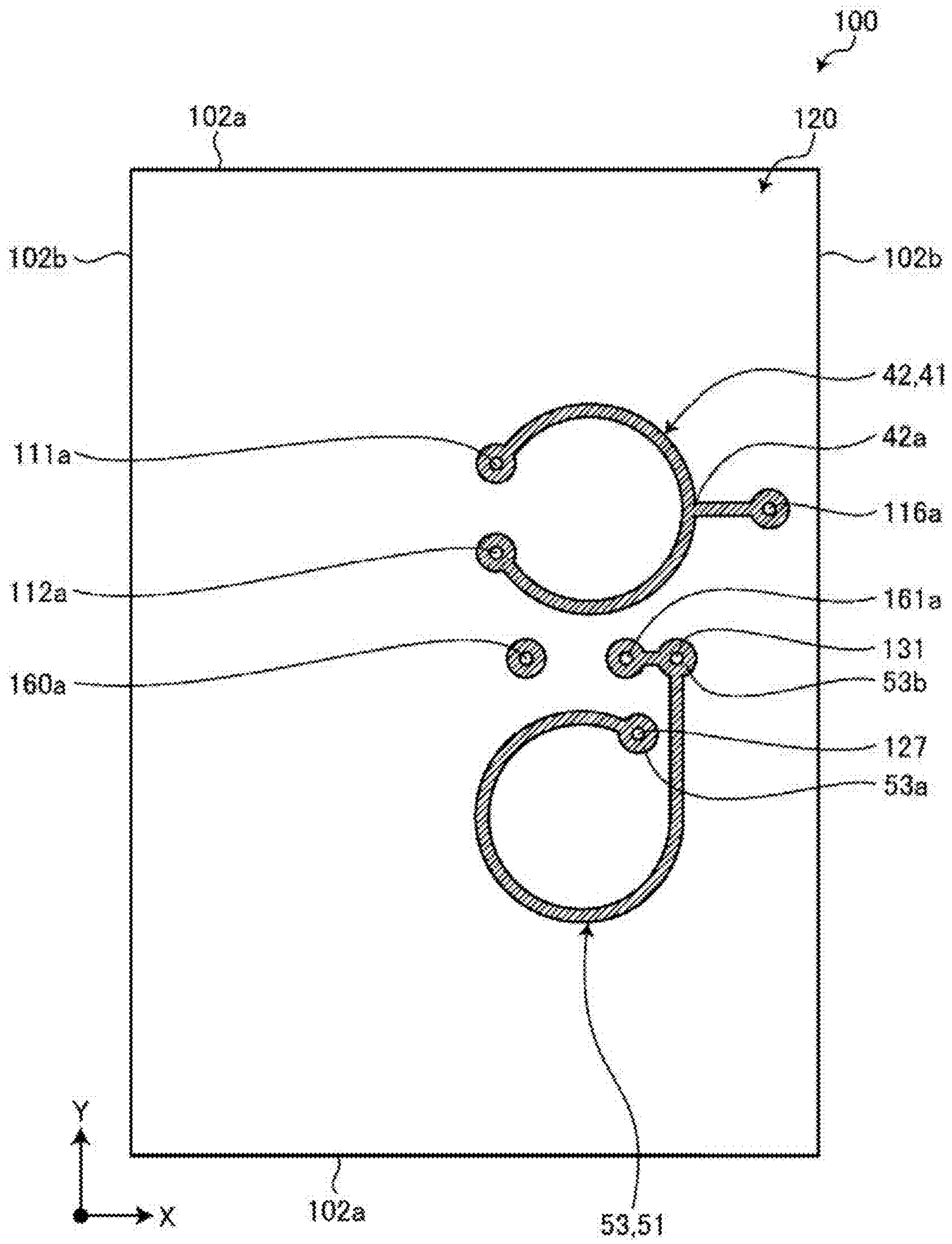
FIG. 8 is a diagram illustrating a layout of a second insulating layer in the power amplification device according to the first embodiment.
Figure 9:
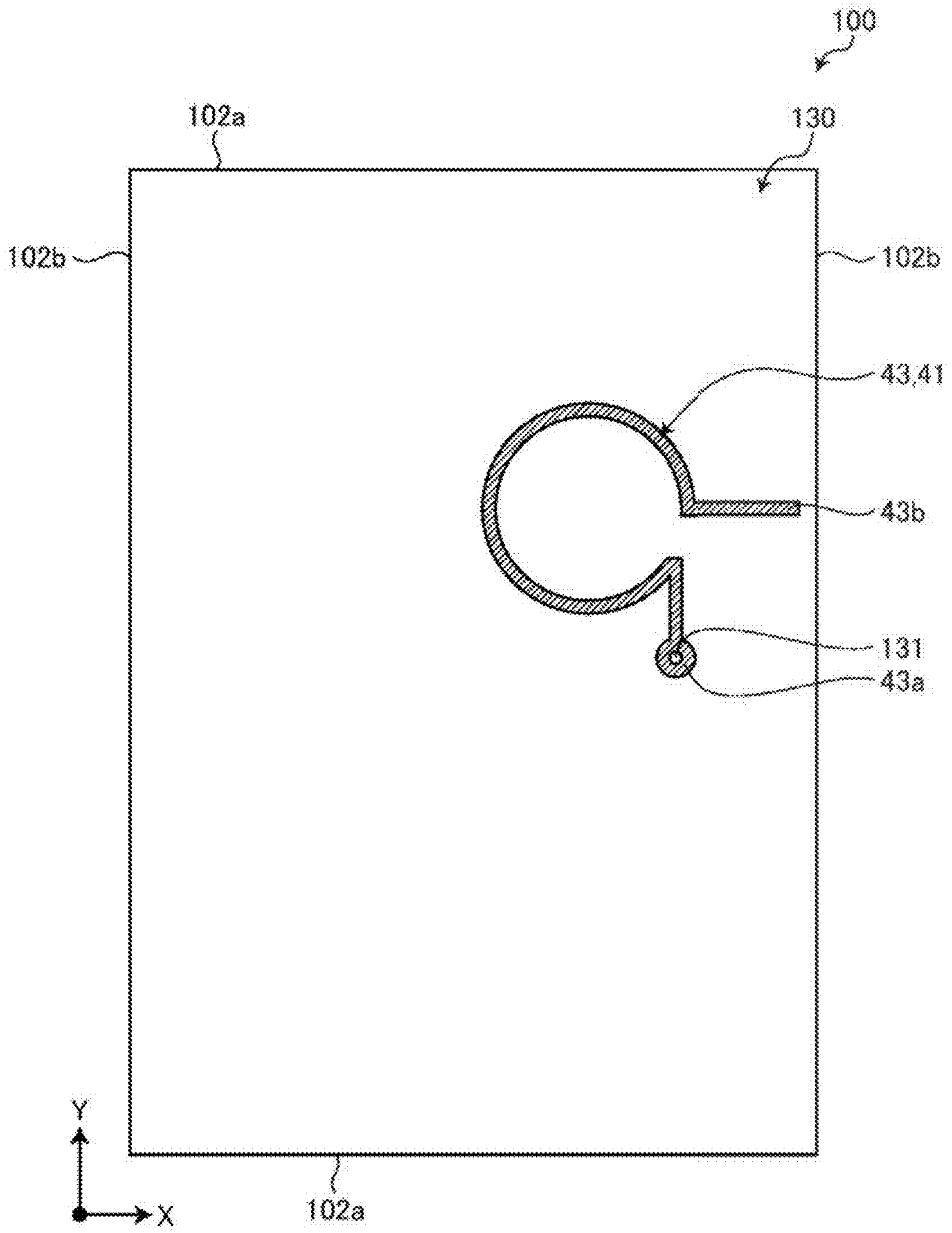
FIG. 9 is a diagram illustrating a layout of a third insulating layer in the power amplification device according to the first embodiment.

FIG. 7 is a plan view of a surface of a substrate in the power amplification device according to the first embodiment. FIG. 8 is a diagram illustrating a layout of a second insulating layer in the power amplification device according to the first embodiment. FIG. 9 is a diagram illustrating a layout of a third insulating layer in the power amplification device according to the first embodiment.

As illustrated in FIG. 7, the power amplification device 100 includes a substrate 101. The substrate 101 has a rectangular shape in plan view. In other words, a surface 102 of the substrate 101 has a rectangular shape. The surface 102 has a pair of short sides 102*a* and a pair of long sides 102*b*.

Hereafter, in a planar direction parallel to the surface 102, a direction parallel to the short sides 102*a* is referred to as a first planar direction X. A direction parallel to the first planar direction X and also parallel to the long sides 102*b* (or a direction that intersects the first planar direction X) is referred to as a second planar direction Y. In the present disclosure, the first planar direction X and the second planar direction Y are not necessarily orthogonal to each other and may intersect with each other.

An integrated circuit 90 is mounted on the surface 102 of the substrate 101. The integrated circuit 90 is a heterojunction bipolar transistor (HBT). Also, the integrated circuit 90 includes the functions of the splitters 30A and 30B, the pair of differential amplifiers 13*a* and 13*b*, and the pair of differential amplifiers 17*a* and 17*b* (see FIG. 6).

Hereafter, a direction in which the integrated circuit 90 and the substrate 101 are arranged is referred to as a stacking direction. Also, a first stacking direction of the stacking direction is a direction from the integrated circuit 90 toward the substrate 101, and a second stacking direction of the stacking direction is opposite the first stacking direction.

As illustrated in FIGS. 7 to 9, the substrate 101 is a multilayer substrate and includes multiple insulating layers arranged in the stacking direction. Among the multiple insulating layers, three insulating layers arranged sequentially from the second stacking direction are referred to as a first insulating layer 110 (see FIG. 7), a second insulating layer 120 (see FIG. 8), and a third insulating layer 130 (see FIG. 9). A surface of the first insulating layer 110 facing the second stacking direction corresponds to the surface 102.

Conductive layers formed by pattern formation are provided on the insulating layers of the substrate 101. Electrodes, wires, and baluns (the carrier balun 41 and the peak balun 51) described below are formed by the conductive layers. In the drawings, to make the areas of the conductive layers easily recognizable, the conductive layers are hatched.

As illustrated in FIG. 7, the primary peak balun 52 is provided on the surface 102 (or the first insulating layer 110). As illustrated in FIG. 8, the primary carrier balun 42 and the secondary peak balun 53 are provided on the second insulating layer 120. As illustrated in FIG. 9, the secondary carrier balun 43 is provided on the third insulating layer 130. Here, each balun has a C shape assuming viewed in the stacking direction.

As illustrated in FIG. 7, electrodes 111, 112, 113, and 114 are provided as conductive layers on the surface 102 (or the first insulating layer 110). The electrodes 111, 112, 113, and 114 are arranged at intervals in the second planar direction Y. Also, the electrodes 111, 112, 113, and 114 are disposed in an area overlapping the integrated circuit 90 and are connected to output terminals (not shown) of the integrated circuit 90. With this configuration, a signal output from the differential amplifier 13*a* (see FIG. 6) is input to the electrode 111. A signal output from the differential amplifier 13*b*

(see FIG. 6) is input to the electrode 112. A signal output from the differential amplifier 17*a* (see FIG. 6) is input to the electrode 113. A signal output from the differential amplifier 17*b* (see FIG. 6) is input to the electrode 114.

The electrodes 113 and 114 are connected to the ends of the primary peak balun 52. Also, the electrodes 111 and 112 are connected to first ends of wires 117 and 118 that extend in the first planar direction X. Interlayer connection conductors 111*a* and 112*a* are provided at second ends of the wires 117 and 118. As illustrated in FIG. 8, the interlayer connection conductors 111*a* and 112*a* extend to the second insulating layer 120 and are connected to the ends of the primary carrier balun 42. Here, in each drawing, the interlayer connection conductors are represented by open circles (no hatching) so that the interlayer connection conductors are easily recognizable.

Also, a wire 115 is provided on the surface 102 (or the first insulating layer 110). The power supply potential Vcc (not shown in FIG. 7, see FIG. 6) is applied to the wire 115. The power supply potential Vcc applied to the wire 115 may also be an external voltage generated outside of the substrate 101. Thus, the present disclosure is not limited to any specific example. The primary peak balun 52 is connected to the wire 115 via a joint point (the midpoint 52*a*). The primary carrier balun 42 is connected to the wire 115 via a joint point (the midpoint 42*a*) and an interlayer connection conductor 116*a*. With this configuration, the power supply potential Vcc is supplied to the primary peak balun 52 and the primary carrier balun 42.

As illustrated in FIG. 8, an interlayer connection conductor 127 is provided at a first end 53*a* of the secondary peak balun 53. The interlayer connection conductor 127 extends to a fourth or subsequent insulating layer (not shown) and is connected to the reference potential GND. An interlayer connection conductor 131 is provided at a second end 53*b* of the secondary peak balun 53. As illustrated in FIG. 9, the interlayer connection conductor 131 extends to the third insulating layer 130 and is connected to a first end 43*a* of the secondary carrier balun 43. With the above configuration, the secondary peak balun 53 and the secondary carrier balun 43 are connected in series with each other. Also, although not illustrated in the drawings, a second end 43*b* of the secondary carrier balun 43 is connected to the load (or antenna) 70.

As illustrated in FIG. 7, electrodes 160 and 161, which are arranged at intervals in the first planar direction X, are provided on the surface 102 (the first insulating layer 110). The capacitor 62 (see FIG. 6), which is a regulator circuit component, is stacked on and soldered to the electrodes 160 and 161. Also, interlayer connection conductors 160*a* and 161*a* are provided at the electrodes 160 and 161, respectively. As illustrated in FIG. 9, the interlayer connection conductor 160*a* extends to the second insulating layer 120 and is connected to the reference potential GND. Also, the interlayer connection conductor 161*a* extends to the second insulating layer 120 and is connected to the second end 53*b* of the secondary peak balun 53. Accordingly, the capacitor 62 and the secondary peak balun 53 are connected in parallel with each other.

According to the first embodiment described above, as illustrated in FIGS. 7 to 9, the baluns (the carrier balun 41 and the peak balun 51) are disposed on one side of the integrated circuit 90 in the first planar direction X1 assuming seen from the stacking direction. Also, the baluns (the carrier balun 41 and the peak balun 51) are arranged at intervals in the second planar direction Y so as not to electromagnetically interfere with each other.

Figure 10:
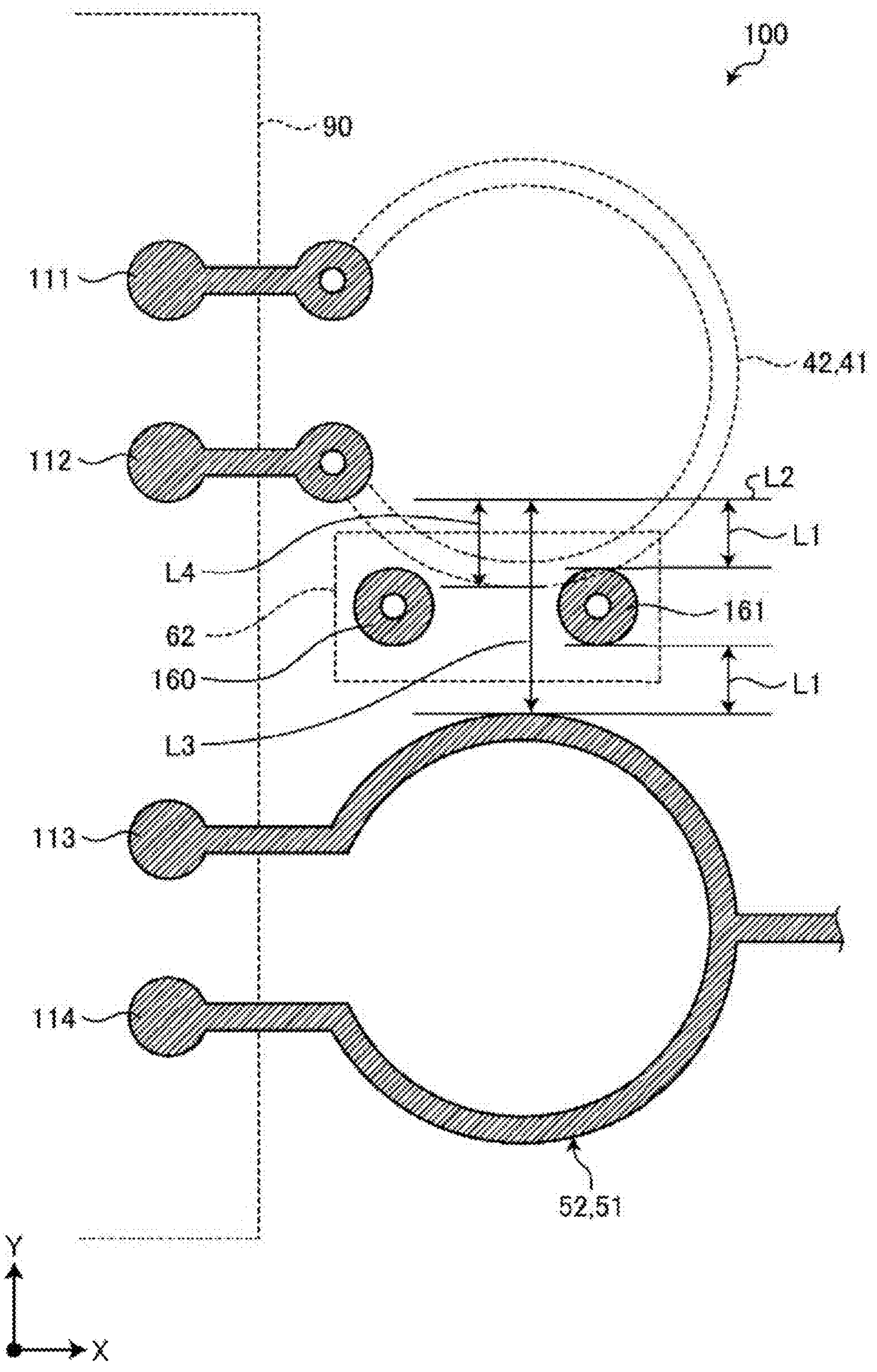
FIG. 10 is an enlarged view of a part of FIG. 7.

FIG. 10 is an enlarged view of a part of FIG. 7. As illustrated in FIG. 10, in a view from the stacking direction, the capacitor 62, which is a regulator circuit component, is disposed between the carrier balun 41 and the peak balun 51. That is, in the present embodiment, the capacitor 62 is disposed in an area that has been a dead space in the related art. This eliminates the need to provide a separate space for the capacitor 62 on the surface 102 of the substrate 101 and thereby reduces the size of the power amplification device 100.

Also, the primary peak balun 52 and the electrodes 160 and 161 are disposed apart from each other by a distance L1. This is to prevent solder for joining the capacitor 62 to the electrodes 160 and 161 from contacting the primary peak balun 52.

Here, assuming the primary carrier balun 42 is disposed on the surface 102 of the substrate 101, for the same reason as described above, the primary carrier balun 42 needs to be placed in a position that is farther away from the electrodes 160 and 161 than a hypothetical line L2 (a hypothetical line that is away from the electrodes 160 and 161 by the distance L1). That is, assuming the primary carrier balun 42 and the primary peak balun 52 are disposed on the surface 102 of the substrate 101, the primary carrier balun 42 and the primary peak balun 52 should be separated from each other by at least a distance L3.

In the present embodiment, the primary carrier balun 42 is not provided on the surface 102 (the first insulating layer 110) of the substrate 101. That is, there is no possibility that the solder joining the capacitor 62 to the electrodes 160 and 161 contacts the primary carrier balun 42. This makes it possible to place the primary carrier balun 42 closer to the primary peak balun 52 beyond the hypothetical line L2.

Also, in a view from the stacking direction, the carrier balun 41 overlaps the electrode 161. That is, the distance between the carrier balun 41 and the peak balun 51 in the present embodiment is smaller by a distance L4 than the distance L3 that is necessary assuming both of the primary carrier balun 42 and the primary peak balun 52 are placed on the substrate 101. For this reason, the size of the power amplification device 100 is reduced.

The first embodiment is described above. Next, variations obtained by modifying parts of the first embodiment are described. Descriptions below are focused on differences from the first embodiment.

First Variation

Figure 11:
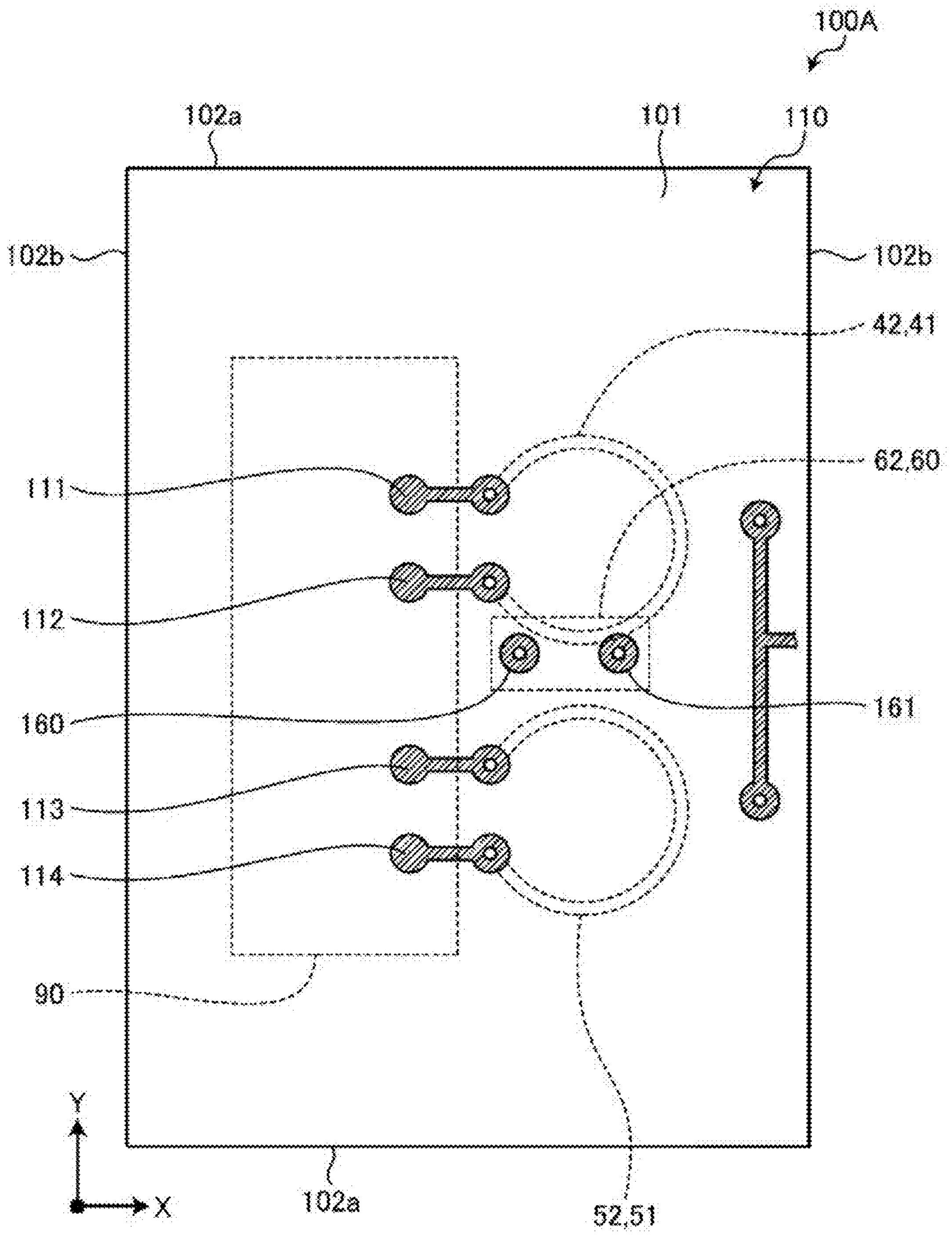
FIG. 11 is a plan view of a surface of a substrate in a power amplification device according to a first variation.

FIG. 11 is a plan view of a surface of a substrate in a power amplification device according to a first variation. As illustrated in FIG. 11, a power amplification device 100A of the first variation differs from the first embodiment in that both the carrier balun 41 and the peak balun 51 are disposed on insulating layers that are farther in the first stacking direction than the surface 102. That is, in the first variation, the primary peak balun 52 is disposed on the second insulating layer 120, and the secondary peak balun 53 is disposed on the third insulating layer 130.

Similarly to the first embodiment, the first variation also makes it possible to reduce the size of the power amplification device 100A. In the first variation, the peak balun 51 does not overlap the electrode 161 in a view from the stacking direction. However, the present disclosure is not limited to this example, and the peak balun 51 may overlap the electrode 161 similarly to the carrier balun 41. This makes it possible to further reduce the size of the power amplification device 100A.

The present disclosure is not limited to the first embodiment and the first variation described above. For example, although one of two baluns is disposed on the surface 102 in the first embodiment, the one of the two baluns disposed on the surface 102 is not limited to the peak balun 51 as in the first embodiment but may instead be the carrier balun 41.

Also, in the present disclosure, a λ/4 transformer, which delays the phase of a radio frequency signal output from the differential amplifiers 17*a* and 17*b* by 90°, may be provided instead of the regulator circuit 60 (the capacitor 62).

Also, although a regulator circuit component (the capacitor 62) is disposed in the dead space in the first embodiment, any component other than a regulator circuit component may be disposed in the dead space in the present disclosure. That is, any surface mount device mounted on the surface 102 may be disposed in the dead space. In an example described below, a surface mount device is placed in the dead space.

Second Variation

Figure 12:
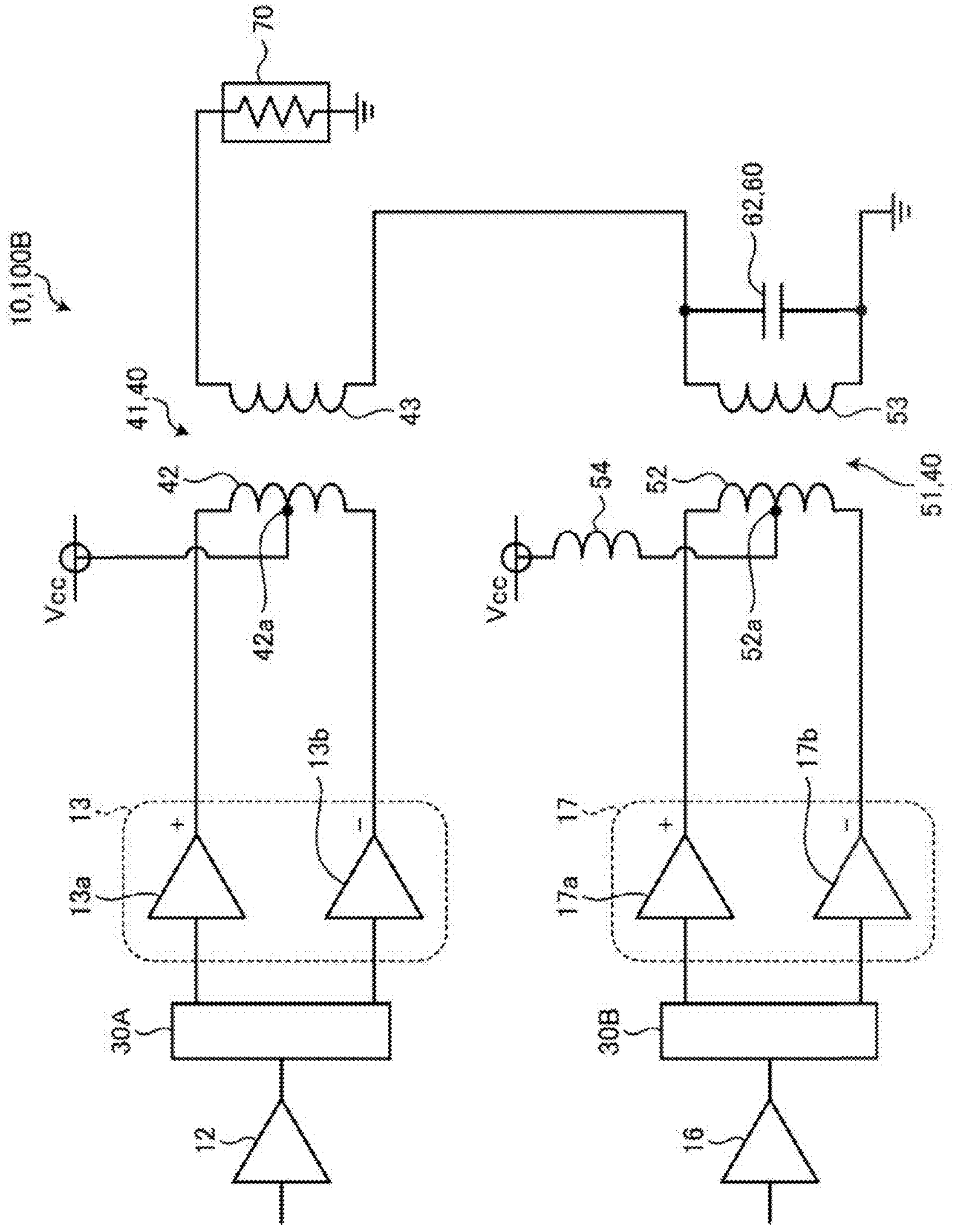
FIG. 12 is a diagram illustrating a circuit configuration of a Doherty circuit of a power amplification device according to a second variation.

FIG. 12 is a diagram illustrating a circuit configuration of a Doherty circuit of a power amplification device according to a second variation. As illustrated in FIG. 12, different from the first embodiment, a Doherty amplifier circuit 10 of a power amplification device 100B of the second variation includes an inductor 54. The inductor 54 is disposed between the power supply potential Vcc and the midpoint 52*a* of the primary peak balun 52. The inductor 54 is a surface mount device mounted on the surface 102 of the substrate 101. Details of layouts are described below.

Figure 13:
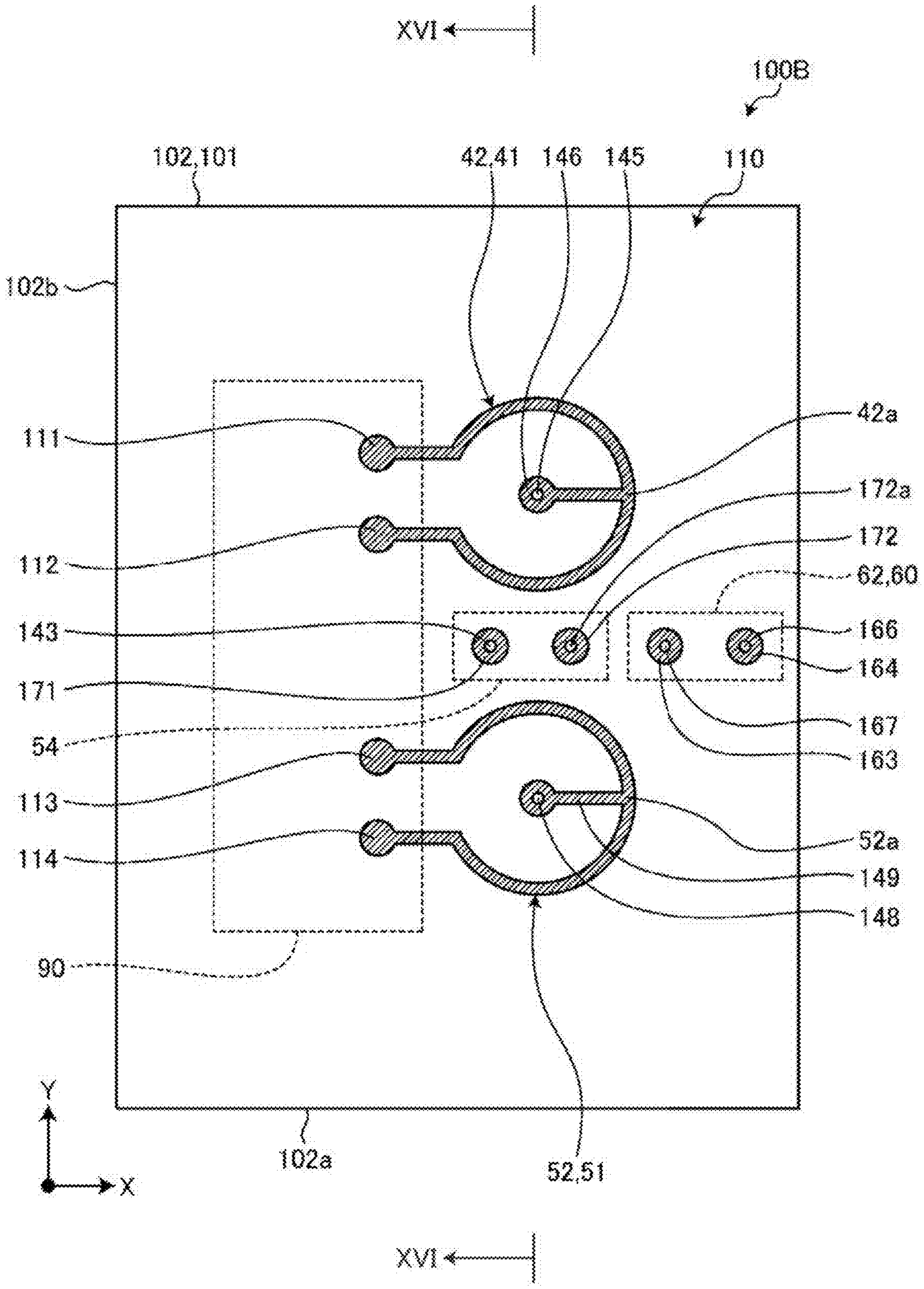
FIG. 13 is a plan view of a surface of a substrate of the power amplification device according to the second variation.
Figure 14:
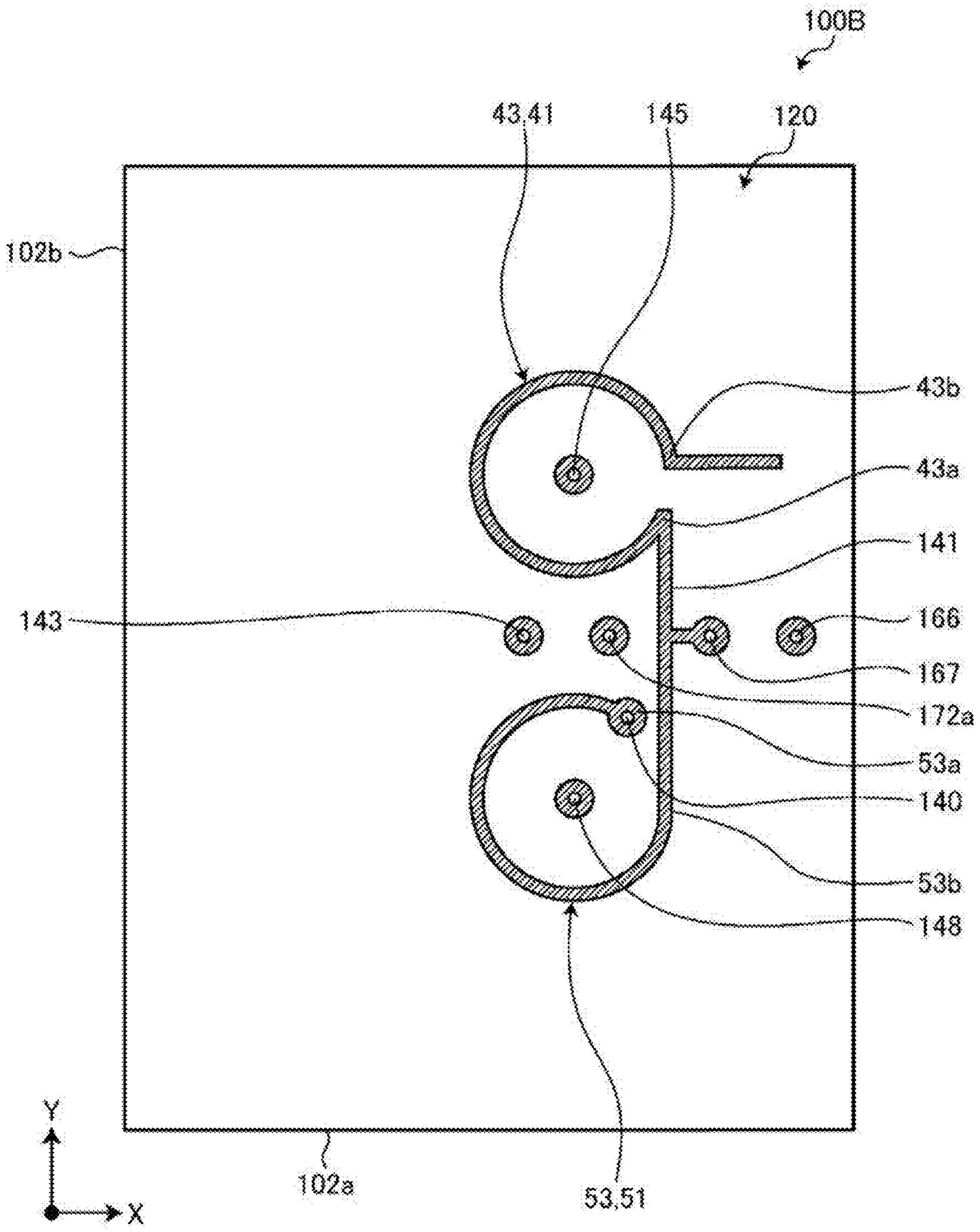
FIG. 14 is a diagram illustrating a layout of a second insulating layer in the power amplification device according to the second variation.
Figure 15:
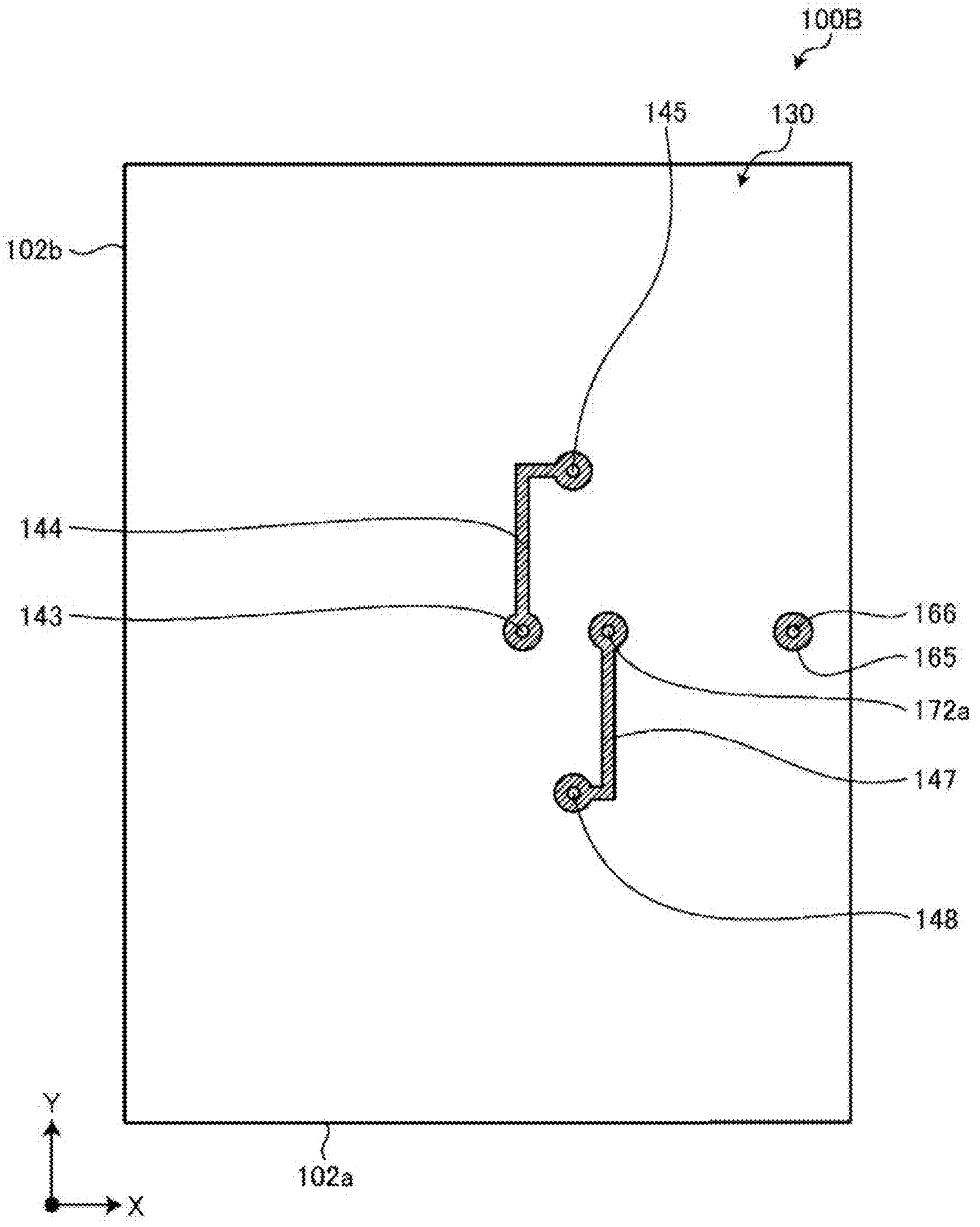
FIG. 15 is a diagram illustrating a layout of a third insulating layer in the power amplification device according to the second variation.

FIG. 13 is a plan view of a surface of a substrate of the power amplification device according to the second variation. FIG. 14 is a diagram illustrating a layout of the second insulating layer in the power amplification device according to the second variation. FIG. 15 is a diagram illustrating a layout of the third insulating layer in the power amplification device according to the second variation.

As illustrated in FIG. 13, the power amplification device 100B of the second variation differs from the first embodiment in that the primary carrier balun 42 is disposed on the surface 102 (the first insulating layer 110) of the substrate 101. As illustrated in FIG. 14, the power amplification device 100B of the second variation differs from the first embodiment in that the secondary carrier balun 43 is disposed on the second insulating layer 120.

Also, in a view from the stacking direction, the inductor 54 is disposed between the primary carrier balun 42 and the primary peak balun 52. The inductor 54 is soldered to electrodes 171 and 172. Also, different from the first embodiment, each of the primary carrier balun 42 and the primary peak balun 52 does not overlap the electrodes 171 and 172 joined to the inductor 54.

Also, the capacitor 62 is disposed on one side of the inductor 54 in the first planar direction X. The capacitor 62 is soldered to electrodes 163 and 164.

As illustrated in FIG. 14, the first end 53*a* of the secondary peak balun 53 is connected to the reference potential GND via an interlayer connection conductor 140. The second end 53*b* of the secondary peak balun 53 is connected to the first end 43*a* of the secondary carrier balun 43 via a wire 141 that extends in the second planar direction Y. Also, although not illustrated in the drawings, the second end 43*b* of the secondary carrier balun 43 is connected to the load (or antenna) 70.

As illustrated in FIG. 12, an electrode 142 disposed between the secondary carrier balun 43 and the secondary peak balun 53 is provided on the second insulating layer 120. The electrode 142 is connected to the power supply potential Vcc. An interlayer connection conductor 143, which extends to the third insulating layer 130 and the first insulating layer, is provided at the electrode 142. As illustrated in FIG. 15, the interlayer connection conductor 143 is connected to a first end of a wire 144 disposed on the third insulating layer 130. A second end of the wire 144 is connected to an interlayer connection conductor 145 that extends to the first insulating layer 110. As illustrated in FIG. 13, the interlayer connection conductor 145 is connected to an electrode 146 that is connected to the midpoint 42*a* of the primary carrier balun 42. With this configuration, the power supply potential Vcc is supplied to the midpoint 42*a* of the primary carrier balun 42.

As illustrated in FIG. 13, the interlayer connection conductor 143 is connected to the electrode 171 on the first insulating layer 110. An interlayer connection conductor 172*a* is provided at the electrode 172. As illustrated in FIG. 15, the interlayer connection conductor 172*a* extends to the third insulating layer 130 and is connected to a first end of a wire 147. A second end of the wire 147 is connected to an interlayer connection conductor 148. Also, as illustrated in FIG. 13, the interlayer connection conductor 148 extends to the first insulating layer 110 and is connected to an electrode 149 connected to the midpoint 52*a* of the primary peak balun 52. With this configuration, the power supply potential Vcc is supplied to the midpoint 52*a* of the primary peak balun 52.

As illustrated in FIG. 15, an electrode 165 connected to the reference potential GND is provided on the third insulating layer 130. An interlayer connection conductor 166 is provided at the electrode 165. As illustrated in FIG. 13, the interlayer connection conductor 166 extends to the first insulating layer 110 and is connected to an electrode 164 that is joined to the capacitor 62. An interlayer connection conductor 167 is provided at the electrode 163. As illustrated in FIG. 14, the interlayer connection conductor 167 extends to the second insulating layer 120 and is connected to the wire 141. Accordingly, the capacitor 62 and the secondary peak balun 53 are connected in parallel with each other.

Figure 16:
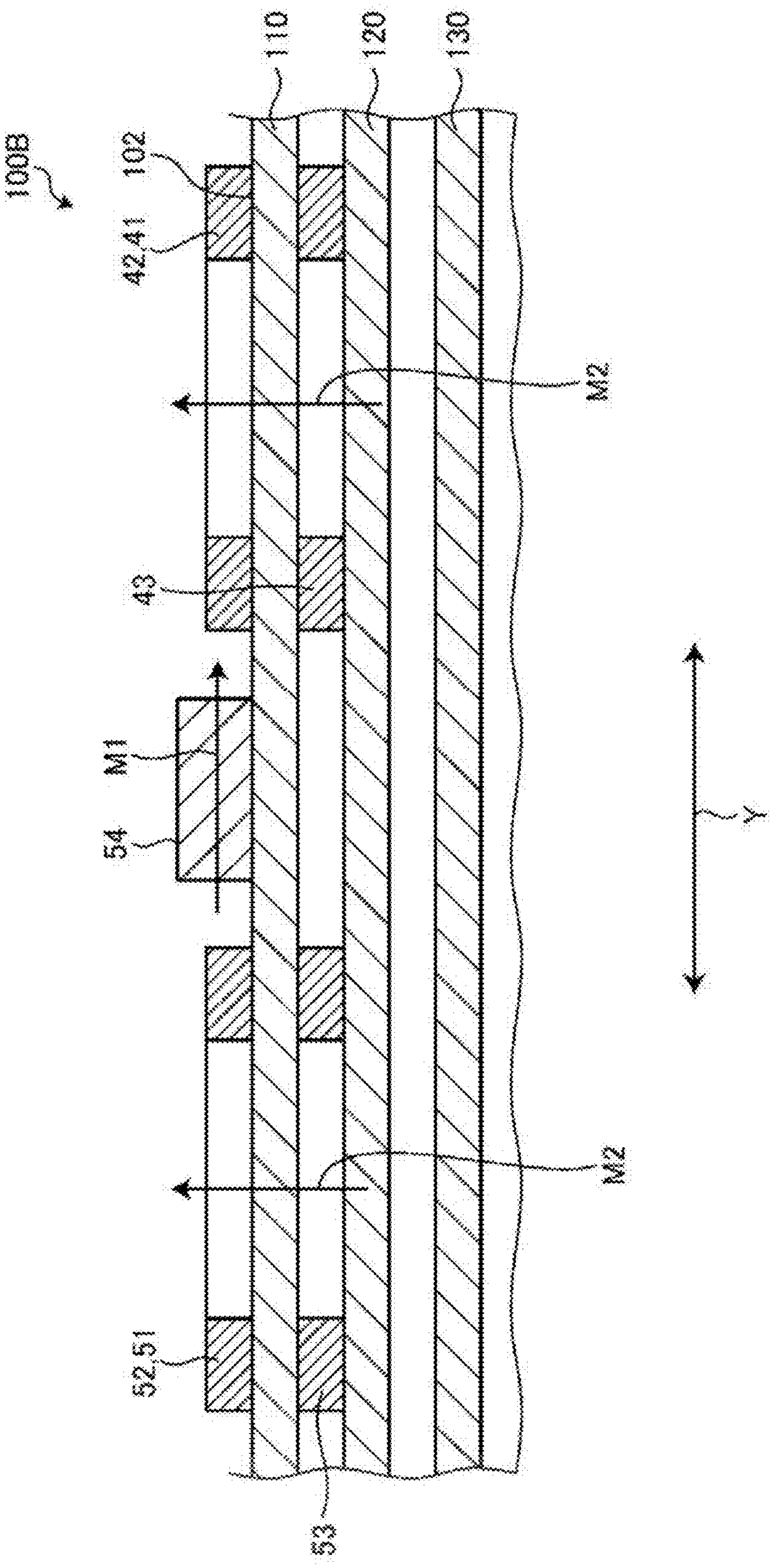
FIG. 16 is a cross-sectional view taken along line XVI-XVI of FIG. 15.

FIG. 16 is a cross-sectional view taken along line XVI-XVI of FIG. 15. As illustrated in FIG. 16, the inductor 54 is a winding around a center line (not shown) extending in the second planar direction Y. Therefore, the direction of the magnetic field passing through the inside of the inductor 54 (see an arrow M1 in FIG. 16) corresponds to the second planar direction Y. On the other hand, as illustrated in FIG. 16, the direction of the magnetic field passing through the inside of each of the carrier balun 41 and the peak balun 51 corresponds to the stacking direction (see arrows M2 in FIG. 16).

According to the third variation described above, the inductor 54 is disposed in an area that has been a dead space in the related art, and therefore the size of the power amplification device 100B is reduced. Also, as illustrated in FIG. 16, the magnetic fields of the carrier balun 41 and the peak balun 51 are orthogonal to the magnetic field of the inductor 54. For this reason, each of the carrier balun 41 and the peak balun 51 is less likely to be magnetically coupled with the inductor 54. Furthermore, the magnetic field of the inductor 54 provides a shielding effect that makes the magnetic fields of the carrier balun 41 and the peak balun 51 less likely to interfere with each other.

In the third variation, both of the carrier balun 41 (the primary carrier balun 42) and the peak balun 51 (the primary peak balun 52) are provided on the surface 102 of the substrate 101. However, in the present disclosure, one of the carrier balun 41 (the primary carrier balun 42) and the peak balun 51 (the primary peak balun 52) may be provided on the surface 102 of the substrate 101. In other words, one of the carrier balun 41 and the peak balun 51 may be provided on an insulating layer that is located farther in the first stacking direction than the first insulating layer 110 forming the surface 102. Furthermore, the other one of the carrier balun 41 and the peak balun 52 may also be provided on an insulating layer that is located farther in the first stacking direction than the first insulating layer 110 forming the surface 102. In other words, both of the carrier balun 41 and the peak balun 51 are not necessarily provided on the first insulating layer 110 and may be provided on the second insulating layer 120 or subsequent insulating layers.

The present disclosure may be implemented by combinations of configurations as described below.

(1)

A power amplification device includes a substrate having a surface; an integrated circuit including a carrier amplifier and a peak amplifier and disposed on the surface; a carrier balun connected to the carrier amplifier; a peak balun connected to the peak amplifier; and a surface mount device disposed on the surface, wherein each of the carrier amplifier and the peak amplifier is a pair of differential amplifiers; a stacking direction indicates a direction in which the integrated circuit and the substrate are arranged; a first stacking direction of the stacking direction indicates a direction from the integrated circuit toward the substrate; a first planar direction indicates a direction parallel to the surface; a second planar direction indicates a direction that is parallel to the surface and intersects the first planar direction; the substrate includes multiple insulating layers arranged in the stacking direction; an electrode to which the surface mount device is soldered is provided on the surface; in a view from the stacking direction, the carrier balun, the electrode, and the peak balun, which are arranged in the second planar direction, are disposed on one side of the integrated circuit in the first planar direction; one of the carrier balun and the peak balun is disposed on one of the insulating layers that is located farther in the first stacking direction than one of the insulating layers that forms the surface, and at least a part of the one of the carrier balun and the peak balun overlaps the electrode in the view from the stacking direction.

(2)

A power amplification device includes a substrate having a surface; an integrated circuit including a carrier amplifier and a peak amplifier and disposed on the surface; a carrier balun connected to the carrier amplifier; a peak balun connected to the peak amplifier; and an inductor that is a surface mount device disposed on the surface, wherein each of the carrier amplifier and the peak amplifier is a pair of differential amplifiers; a stacking direction indicates a direction in which the integrated circuit and the substrate are arranged; a first stacking direction of the stacking direction indicates a direction from the integrated circuit toward the substrate; a first planar direction indicates a direction parallel to the surface; a second planar direction indicates a direction that is parallel to the surface and intersects the first planar direction; the substrate includes multiple insulating layers arranged in the stacking direction; the carrier balun includes a primary carrier balun and a secondary carrier balun each of which includes a winding whose center line extends in the stacking direction; one of the primary carrier balun and the secondary carrier balun is disposed on the surface, and another one of the primary carrier balun and the secondary carrier balun is disposed on one of the insulating layers that is located farther in the first stacking direction than one of the insulating layers that forms the surface; the peak balun includes a primary peak balun and a secondary peak balun each of which includes a winding whose center line extends in the stacking direction; one of the primary peak balun and the secondary peak balun is disposed on the surface, and another one of the primary peak balun and the secondary peak balun is disposed on one of the insulating layers that is located farther in the first stacking direction than the one of the insulating layers that forms the surface; in a view from the stacking direction, the carrier balun, the inductor, and the peak balun, which are arranged in the second planar direction, are disposed on one side of the integrated circuit in the first planar direction; and a center line of a winding of the inductor extends in the second planar direction.

(3)

A power amplification device includes a substrate having a surface; an integrated circuit including a carrier amplifier and a peak amplifier and disposed on the surface; a carrier balun connected to the carrier amplifier; a peak balun connected to the peak amplifier; and an inductor that is a surface mount device disposed on the surface, wherein each of the carrier amplifier and the peak amplifier is a pair of differential amplifiers; a stacking direction indicates a direction in which the integrated circuit and the substrate are arranged; a first stacking direction of the stacking direction indicates a direction from the integrated circuit toward the substrate; a first planar direction indicates a direction parallel to the surface; a second planar direction indicates a direction that is parallel to the surface and intersects the first planar direction; the substrate includes multiple insulating layers arranged in the stacking direction; in a view from the stacking direction, the carrier balun, the inductor, and the peak balun, which are arranged in the second planar direction, are disposed on one side of the integrated circuit in the first planar direction; the carrier balun includes a primary carrier balun and a secondary carrier balun that are disposed on different ones of the insulating layers, a center line of a winding of each of the primary carrier balun and the secondary carrier balun extending in the stacking direction; the peak balun includes a primary peak balun and a secondary peak balun that are disposed on different ones of the insulating layers, a center line of a winding of each of the primary peak balun and the secondary peak balun extending in the stacking direction; one of the carrier balun and the peak balun is disposed on one of the insulating layers that is located farther in the first stacking direction than one of the insulating layers that forms the surface; and a center line of a winding of the inductor extends in the second planar direction.

(4)

The power amplification device as described in (1), wherein another one of the carrier balun and the peak balun is disposed on one of the insulating layers that is located farther in the first stacking direction than the one of the insulating layers that forms the surface.

(5)

The power amplification device as described in (1) or (4), wherein the surface mount device is a regulator circuit component.

(6)

The power amplification device as described in (5), wherein the regulator circuit component is a capacitor.

(7)

The power amplification device as described in (3), wherein another one of the carrier balun and the peak balun is disposed on one of the insulating layers that is located farther in the first stacking direction than the one of the insulating layers that forms the surface.

What is claimed is:

1. A power amplification device comprising:

a substrate having a surface;

an integrated circuit including a carrier amplifier and a peak amplifier and that is disposed on the surface;

a carrier balun connected to the carrier amplifier;

a peak balun connected to the peak amplifier; and a surface mount device disposed on the surface, wherein each of the carrier amplifier and the peak amplifier is a pair of differential amplifiers;

a stacking direction indicates a direction in which the integrated circuit and the substrate are arranged;

a first stacking direction of the stacking direction indicates a direction from the integrated circuit toward the substrate;

a first planar direction indicates a direction parallel to the surface;

a second planar direction indicates a direction that is parallel to the surface and intersects the first planar direction;

the substrate includes multiple insulating layers arranged in the stacking direction;

an electrode to which the surface mount device is soldered is provided on the surface;

in a view from the stacking direction, the carrier balun, the electrode, and the peak balun, which are arranged in the second planar direction, are disposed on one side of the integrated circuit in the first planar direction; and one of the carrier balun or the peak balun is disposed on one of the insulating layers that is located farther in the first stacking direction than one of the insulating layers that forms the surface, and at least a part of the one of the carrier balun or the peak balun overlaps the electrode in the view from the stacking direction.

2. A power amplification device comprising:

a substrate having a surface;

an integrated circuit including a carrier amplifier and a peak amplifier and disposed on the surface;

a carrier balun connected to the carrier amplifier;

a peak balun connected to the peak amplifier; and an inductor that is a surface mount device disposed on the surface, wherein each of the carrier amplifier and the peak amplifier is a pair of differential amplifiers;

a stacking direction indicates a direction in which the integrated circuit and the substrate are arranged;

a first stacking direction of the stacking direction indicates a direction from the integrated circuit toward the substrate;

a first planar direction indicates a direction parallel to the surface;

a second planar direction indicates a direction that is parallel to the surface and intersects the first planar direction;

the substrate includes multiple insulating layers arranged in the stacking direction;

the carrier balun includes a primary carrier balun and a secondary carrier balun each of which includes a winding whose center line extends in the stacking direction;

one of the primary carrier balun or the secondary carrier balun is disposed on the surface, and another one of the primary carrier balun or the secondary carrier balun is disposed on one of the insulating layers that is located farther in the first stacking direction than one of the insulating layers that forms the surface;

the peak balun includes a primary peak balun and a secondary peak balun each of which includes a winding whose center line extends in the stacking direction;

one of the primary peak balun or the secondary peak balun is disposed on the surface, and another one of the primary peak balun or the secondary peak balun is disposed on one of the insulating layers that is located farther in the first stacking direction than the one of the insulating layers that forms the surface;

in a view from the stacking direction, the carrier balun, the inductor, and the peak balun, which are arranged in the second planar direction, are disposed on one side of the integrated circuit in the first planar direction; and a center line of a winding of the inductor extends in the second planar direction.

3. A power amplification device comprising:

a substrate having a surface;

an integrated circuit including a carrier amplifier and a peak amplifier and that is disposed on the surface;

a carrier balun connected to the carrier amplifier;

a peak balun connected to the peak amplifier; and an inductor that is a surface mount device disposed on the surface, wherein each of the carrier amplifier and the peak amplifier is a pair of differential amplifiers;

a stacking direction indicates a direction in which the integrated circuit and the substrate are arranged;

a first stacking direction of the stacking direction indicates a direction from the integrated circuit toward the substrate;

a first planar direction indicates a direction parallel to the surface;

a second planar direction indicates a direction that is parallel to the surface and intersects the first planar direction;

the substrate includes multiple insulating layers arranged in the stacking direction;

in a view from the stacking direction, the carrier balun, the inductor, and the peak balun, which are arranged in the second planar direction, are disposed on one side of the integrated circuit in the first planar direction;

the carrier balun includes a primary carrier balun and a secondary carrier balun that are disposed on different ones of the insulating layers, a center line of a winding of each of the primary carrier balun and the secondary carrier balun extending in the stacking direction;

the peak balun includes a primary peak balun and a secondary peak balun that are disposed on different ones of the insulating layers, a center line of a winding of each of the primary peak balun and the secondary peak balun extending in the stacking direction;

one of the carrier balun and the peak balun is disposed on one of the insulating layers that is located farther in the first stacking direction than one of the insulating layers that forms the surface; and a center line of a winding of the inductor extends in the second planar direction.

4. The power amplification device according to claim 1, wherein another one of the carrier balun and the peak balun is disposed on one of the insulating layers that is located farther in the first stacking direction than the one of the insulating layers that forms the surface.

5. The power amplification device according to claim 1, wherein the surface mount device is a regulator circuit component.

6. The power amplification device according to claim 5, wherein the regulator circuit component is a capacitor.

7. The power amplification device according to claim 3, wherein another one of the carrier balun and the peak balun is disposed on one of the insulating layers that is located farther in the first stacking direction than the one of the insulating layers that forms the surface.

8. The power amplification device according to claim 4, wherein the surface mount device is a regulator circuit component.

9. The power amplification device according to claim 8, wherein the regulator circuit component is a capacitor.

10. The power amplification device according to claim 1, wherein the one of the carrier balun or the peak balun is the carrier balun.

11. The power amplification device according to claim 1, wherein the one of the carrier balun or the peak balun is the peak balun.

12. The power amplification device according to claim 2, wherein the one of the primary carrier balun or the secondary carrier balun that is disposed on the surface is the primary carrier balun, and the another one of the primary carrier balun or the secondary carrier balun is the secondary carrier balun.

13. The power amplification device according to claim 2, wherein the one of the primary carrier balun or the secondary carrier balun that is disposed on the surface is the secondary carrier balun, and the another one of the primary carrier balun or the secondary carrier balun is the primary carrier balun.

14. The power amplification device according to claim 2, wherein the one of the primary peak balun or the secondary peak balun that is disposed on the surface is the primary peak balun, and the another one of the primary peak balun or the secondary peak balun is the secondary peak balun.

15. The power amplification device according to claim 2, wherein the one of the primary peak balun or the secondary peak balun that is disposed on the surface is the secondary peak balun, and the another one of the primary peak balun or the secondary peak balun is the primary peak balun.

16. The power amplification device according to claim 3, wherein the one of the carrier balun or the peak balun is the carrier balun.

17. The power amplification device according to claim 3, wherein the one of the carrier balun or the peak balun is the peak balun.

18. The power amplification device according to claim 10, wherein the surface mount device is a regulator circuit component.

19. The power amplification device according to claim 18, wherein the regulator circuit component is a capacitor.

20. The power amplification device according to claim 11, wherein the surface mount device is a regulator circuit component, and the regulator circuit component is a capacitor.

* * * * *